(12) United States Patent
Kim et al.

(10) Patent No.: US 10,656,671 B2
(45) Date of Patent: May 19, 2020

(54) DISPLAY DEVICE

(71) Applicant: SAMSUNG ELECTRONICS CO., LTD., Suwon-si, Gyeonggi-do (KR)

(72) Inventors: Hee Bong Kim, Suwon-si (KR); Tae Hun Kim, Suwon-si (KR); Yong Gu Do, Suwon-si (KR); Gil Jae Lee, Suwon-si (KR); Pil Kwon Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/425,171

(22) Filed: May 29, 2019

(65) Prior Publication Data

US 2020/0097043 A1    Mar. 26, 2020

(30) Foreign Application Priority Data

Sep. 21, 2018    (KR) .......................... 10-2018-0114338

(51) Int. Cl.
*G06F 1/16* (2006.01)
*H05K 5/02* (2006.01)
(Continued)

(52) U.S. Cl.
CPC ........... *G06F 1/1601* (2013.01); *F16M 11/24* (2013.01); *H05K 5/0017* (2013.01); *H05K 5/0234* (2013.01)

(58) Field of Classification Search
CPC ............................ H05K 5/0234; G06F 1/1601
(Continued)

(56) References Cited

U.S. PATENT DOCUMENTS 5,887,962 A * 3/1999 Tsai ....................... F16M 11/22
                                                  248/188.1
7,646,593 B2 * 1/2010 Smejkalova ............ G06F 1/162
                                                  361/679.21
(Continued)

FOREIGN PATENT DOCUMENTS

KR    10-2005-0091771    9/2005
KR    10-2006-0071052    6/2006
(Continued)

OTHER PUBLICATIONS

International Search Report dated Jan. 17, 2020 from International Application No. PCT/KR2019/011996, 4 pages.

*Primary Examiner* — Adrian S Wilson
(74) *Attorney, Agent, or Firm* — Staas & Halsey LLP

(57) ABSTRACT

Provided is a display device including a display panel configured to display an image forward. The display device includes a top chassis arranged on the front of the display panel; a bottom chassis arranged on the back of the display panel; a rear cover covering the back of the bottom chassis; and a stand unit including a stand provided to support the display device, a locking device provided to lock the stand to be pulled in between the bottom chassis and the rear cover, and a rotation guide provided to rotate at least a portion of the stand, wherein the rear cover includes a through hole formed for the stand to move vertically, and the stand is locked in the locking device and pulled in between the bottom chassis and the rear cover, or the stand is pulled out of the display device through the through hole.

20 Claims, 26 Drawing Sheets

(51) Int. Cl.
*H05K 5/00* (2006.01)
*F16M 11/24* (2006.01)

(58) Field of Classification Search
USPC .............. 361/679.21, 679.59; 248/125.8
See application file for complete search history.

(56) References Cited

U.S. PATENT DOCUMENTS

| | | | | |
|---|---|---|---|---|
| 7,703,736 | B2 * | 4/2010 | Oh ................... | F16M 11/38 |
| | | | | 16/221 |
| 8,000,092 | B2 * | 8/2011 | Kim .................. | F16M 11/22 |
| | | | | 248/917 |
| 8,390,996 | B2 * | 3/2013 | Park ................. | F16M 11/24 |
| | | | | 248/917 |
| 8,418,987 | B2 * | 4/2013 | Kakuta ............. | F16M 13/005 |
| | | | | 248/917 |
| 8,654,526 | B2 * | 2/2014 | Wu ................... | H04N 5/64 |
| | | | | 248/188 |
| D721,713 | S * | 1/2015 | Ko .................... | D14/451 |
| D838,720 | S * | 1/2019 | Grundstrom ...... | D14/374 |
| 2003/0081376 | A1 * | 5/2003 | Helot ................ | A47B 91/02 |
| | | | | 361/679.59 |
| 2005/0050784 | A1 * | 3/2005 | Bang ................. | F16M 11/22 |
| | | | | 40/607.01 |
| 2006/0279189 | A1 * | 12/2006 | Jeong ............... | H05K 5/02 |
| | | | | 313/46 |
| 2008/0005945 | A1 * | 1/2008 | Fritsche ........... | G09F 11/21 |
| | | | | 40/603 |
| 2008/0239643 | A1 * | 10/2008 | Min .................. | F16M 11/22 |
| | | | | 361/679.05 |
| 2010/0050489 | A1 * | 3/2010 | Merner ............. | G09F 15/0025 |
| | | | | 40/604 |
| 2018/0064092 | A1 | 3/2018 | Maggiore | |

FOREIGN PATENT DOCUMENTS

KR 10-2012-0107424 10/2012
KR 10-2016-0123616 10/2016

* cited by examiner

DISPLAY DEVICE

CROSS-REFERENCE TO RELATED APPLICATION

This application is based on and claims priority under 35 U.S.C. § 119 to Korean Patent Application No. 10-2018-0114338 filed on Sep. 21, 2018, in the Korean Intellectual Property Office, the disclosure of which is incorporated herein by reference in its entirety.

BACKGROUND

1. Field of the Invention

The present disclosure relates to a display device, and more particularly, to a display device including a stand unit.

2. Discussion of Related Art

Generally, display devices are apparatuses for displaying a screen, such as monitors, televisions, etc. The display device may include an actively light-emitting display panel such as Organic Light Emitting Diodes (OLEDs) and a passively light-emitting display panel such as Liquid Crystal Displays (LCDs).

Modern display devices may be used by being installed on the wall or by being held up by a stand on the floor depending on the user's preference.

SUMMARY OF THE INVENTION

The present disclosure provides a display device including a stand unit having an enhanced structure to selectively pull in a stand member that supports the display device on the floor.

The present disclosure also provides a display device including a stand member that is not exposed when the display device is installed on the wall.

The present disclosure also provides a display device having a stand member easily pulled out to support the display device on the floor.

In accordance with an aspect of the disclosure, a display device including a display panel configured to display an image forward includes a top chassis arranged on the front of the display panel; a bottom chassis arranged on the back of the display panel; a rear cover covering the back of the bottom chassis; and a stand unit including a stand provided to support the display device, a locking device provided to lock the stand to be pulled in between the bottom chassis and the rear cover (in an area which can be referred to as an open space) and a rotation guide provided to rotate at least a portion of the stand, wherein the rear cover includes a through hole (which can be referred to as an opening) formed for the stand to move vertically, and the stand is locked in the locking device and pulled in between the bottom chassis and the rear cover, or the stand is pulled out of the display device through the through hole.

The locking device may be arranged on the top of the stand to release the stand from a state of being locked by the locking device when the stand is pushed up, and to lock the stand when the stand is inserted to the locking device by being pushed up in an unlocked state.

The stand may be moved down and pulled out of the display device when released by the locking device from a locked state.

The locking device may be provided to lock or unlock the stand when the stand is pushed.

The stand may include a body portion, a locked portion arranged on the top of the body portion and locked in the locking device, and a supporting portion arranged beneath the body portion and pulled out of the display device to support the display device when the stand is unlocked.

The supporting portion may include a first supporter and a second supporter, and the first and second supporters may be provided to contact each other when the stand is pulled into the display device, and to be unfolded when the stand is pulled out of the display device.

The supporting portion may further include a rotation shaft, and the first and second supporters may be provided to be unfolded by being rotated around the rotation shaft in a state of contacting each other.

The supporting portion may include an elastic member arranged in the supporting portion, and the elastic member may be provided to transmit elastic force to rotate the first and second supporters.

The stand unit may further include a gas cylinder provided to contract or expand by being engaged with vertical movement of the body portion, and the gas cylinder may be provided to apply pressure to the body portion to rotate the first and second supporters.

The stand unit may further include a transmitter provided to transmit force created by the gas cylinder to the body portion, and the body portion may include a gear portion driven by the transmitter, and the gear portion may be provided to be rotated to enable the first and second supporters to be rotated.

The rotation shaft may extend in a direction corresponding to a direction in which the body portion extends.

The rotation shaft may extend in a direction parallel to length of the display panel.

The stand unit may further include a restricting member provided to constrain the first and second supporters to restrict rotation of the first and second supporters.

The stand unit may further include a housing provided to cover the body portion, and the housing may include a guide projection to guide movement of the body portion, and the body portion may include a rail in which the guide projection is inserted.

The rail may include a first area for guiding the guide projection into a vertical direction and a second area for guiding the guide projection to be rotationally moved.

In accordance with another aspect of the disclosure, a display device including a display panel configured to display an image forward, the display device includes a top chassis arranged on the front of the display panel; a bottom chassis arranged on the back of the display panel; a rear cover covering the back of the bottom chassis; and a stand unit including a stand provided to support the display device and a rotation shaft provided for the stand to be rotated around, wherein the stand is provided to be pulled into the rear cover, or pulled out of the rear cover and rotated around the rotation shaft to support the display device.

The rear cover may include a storage groove arranged on a rear side of the rear cover to receive the stand.

The rotation shaft may include a first rotation shaft provided to have both ends settled in the rear cover and to rotate the stand in a first direction, and a second rotation shaft provided to be inserted to the stand to rotate the stand in a second direction.

The stand may be provided to slide down in the storage groove to be pulled out of the storage groove.

In accordance with another aspect of the disclosure, a display device including a display panel configured to display an image forward, the display device includes a top chassis arranged on the front of the display panel; a bottom chassis arranged on the back of the display panel; a rear cover covering the back of the bottom chassis; and a stand unit including a stand provided to support the display device and a rotation shaft provided for the stand to be rotated around, wherein the stand unit is provided for the stand to be selectively placed in a first position in which the stand is settled within frames of the display device and in a second position in which the stand is pulled out of the frames of the display device and rotated around the rotation shaft to support the display device.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
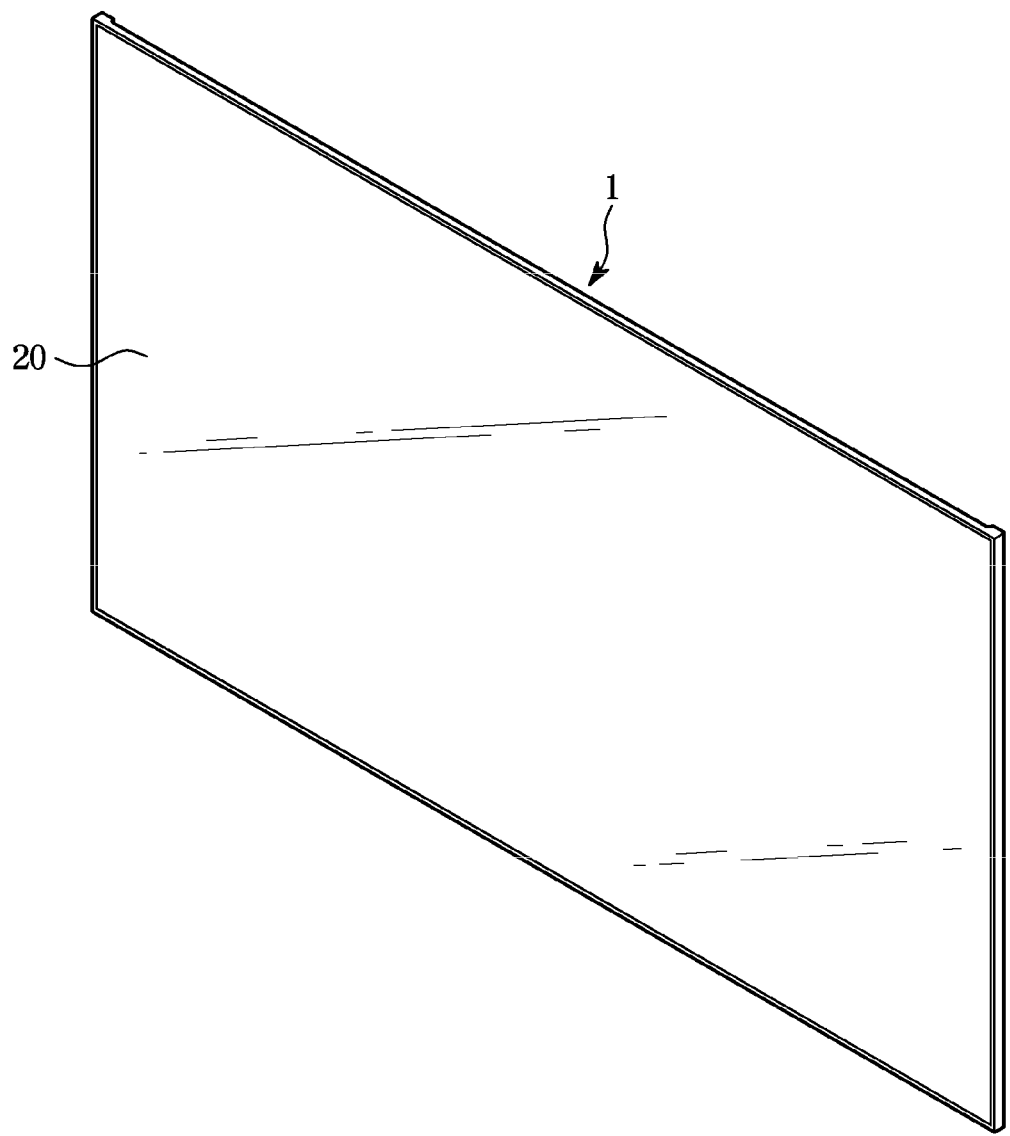
FIG. 1 is a perspective view of a display apparatus, according to a first embodiment of the present disclosure.

Embodiments and features as described and illustrated in the present disclosure are only preferred examples, and various modifications thereof may also fall within the scope of the disclosure.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or chamber discussed below could be termed a second element, component, region, layer or section without departing from the teachings of the present disclosure. Descriptions shall be understood as to include any and all combinations of one or more of the associated listed items when the items are described by using the conjunctive term "~ and/or ~," or the like.

Reference will now be made in detail to embodiments, examples of which are illustrated in the accompanying drawings, wherein like reference numerals refer to the like elements throughout.

Figure 2:
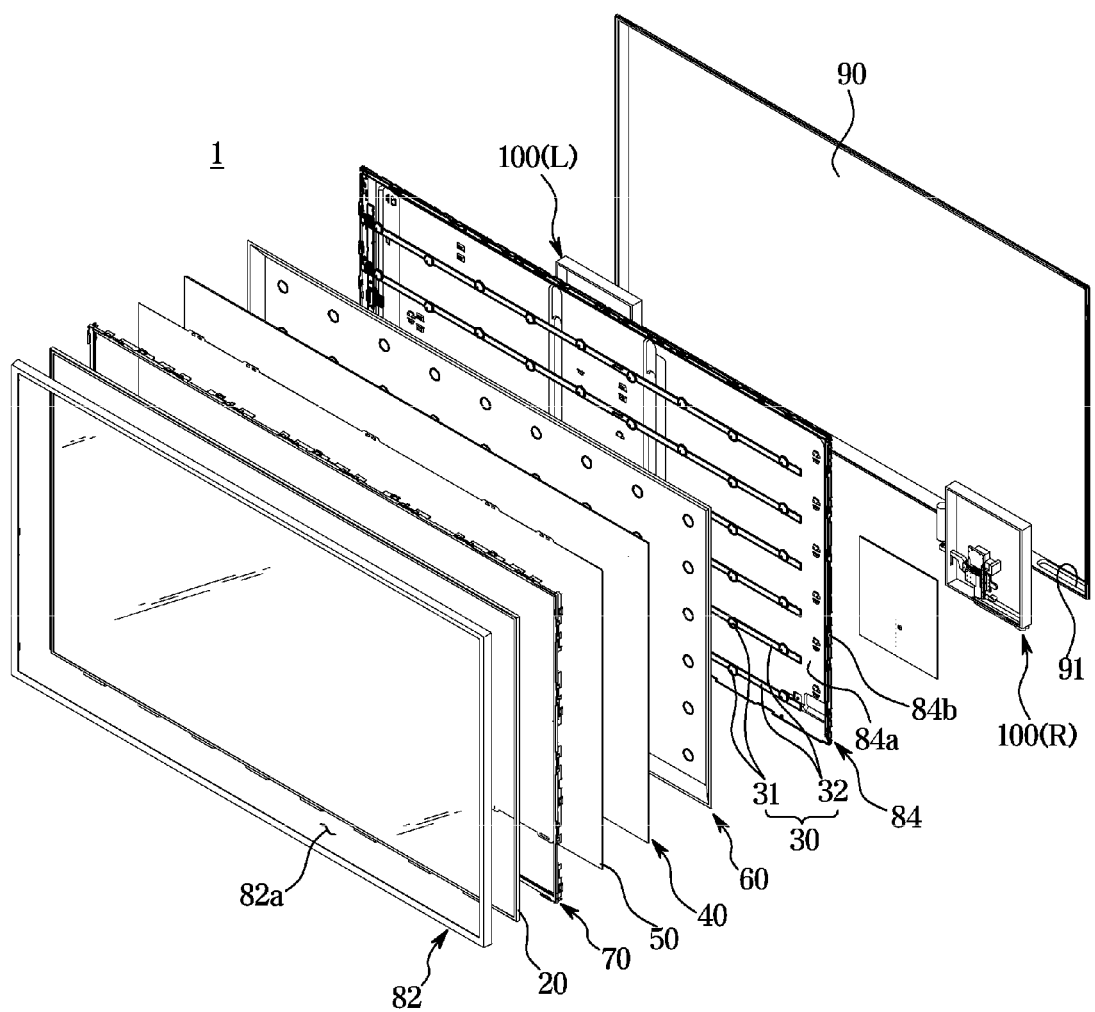
FIG. 2 is an exploded perspective view of the display device, according to the first embodiment of the disclosure.

FIG. 1 is a perspective view of a display device, according to a first embodiment of the disclosure, and FIG. 2 is an exploded perspective view of the display device, according to the first embodiment of the disclosure.

While the following description will focus on a flat display device 1, embodiments of the disclosure may be applied to bendable display devices as well. Although a passively light-emitting display will be focused in the following description, it is, of course, possible that embodiments of the disclosure may be applied to an actively light-emitting display.

The terms 'forward' and 'front' are defined with respect to the a display panel 20 of the display device 1 shown in FIG. 1, i.e., the front side of the display panel 20 on which an image is displayed. The terms 'top (or upper side)' and 'bottom (or lower side)' indicates top and bottom of the display device 1 shown in FIG. 1, respectively, and 'both sides' and 'sideways (or laterally)' refer to the horizontal direction of the display device 1.

The display device 1 may include a display module for displaying an image.

The display device 1 may include a chassis assembly that accommodates and supports the display panel 20 and a backlight unit.

The display panel 20 may include a liquid crystal panel formed of liquid crystals (not shown) enclosed between two glass panels (not shown) each having an electrode, and display an image on the front.

The chassis assembly may include a top chassis 82, a middle mold 70, and a bottom chassis 84.

The top chassis 82 may include an opening 82a to disclose the display panel 20. The bottom chassis 84 may include a bottom part 84a arranged under the backlight unit, and a bottom side part 84b extending upward from the bottom part 84a.

Many different components of the display device 1, such as the top chassis 82 and the middle mold 70 may be supported on the bottom chassis 84.

The bottom chassis 84 may serve to radiate heat generated from a light source 31 to the outside. Specifically, the heat generated from the light source 31 may be conveyed to the bottom chassis 84 through a printed circuit board (PCB) 32, and radiated from the bottom chassis 84. For this, the bottom chassis 84 may be formed of aluminum, various metals such as SUS, or plastics such as ABS, which has good heat conductivity. Also for the PCB 32, a metal such as aluminum with good heat conductivity may be used.

In another embodiment, however, at least one of the top chassis 82, the middle mold 70, and the bottom chassis 84 may be omitted or integrated with another.

The display device 1 may further include a rear cover 90 for covering the chassis assembly to protect and accommodate the chassis assembly and covering the rear side of the bottom chassis 84.

The display device 1 may further include a backlight unit provided to supply light to the display panel 20.

In the embodiment, the backlight unit may be of a direct type in which the light source 31 is arranged right beneath the display panel 20. The backlight unit may include a light source module 30 that includes the light source 31 and the PCB 32 with the light source mounted thereon, and various optical sheets 50 arranged in a traveling path of light radiated from the light source 31.

The light source 31 may be provided to supply light to the display panel 20. The light source 31 may include light emitting diodes (LEDs). The LEDs may be provided in a package in which an LED chip is mounted on a substrate and which is filled with resins. Unlike this, in another embodiment, a cold cathode fluorescent lamp (CCFL) or an external electrode fluorescent lamp (EEFL) may be used for the light source.

A plurality of light sources 31 may be mounted on the PCB 32 at certain intervals. For example, a circuit pattern to convey driving power and signals to the light sources 31 may be formed on the PCB 32. The PCB 32 may be safely arranged on the bottom chassis 84.

Light output from the light source 31 may be directly supplied to the display panel 20 unlike in an edge type display device. It is not limited thereto, and the rear cover 90, and a stand member 200, which will be described later, of the display device 1 according to the disclosure may also be applied in an edge-type display device.

In this regard, to improve optical characteristics of light output from the light source 31, the optical sheet 50 may be arranged between the light source 31 and the display panel 20.

The backlight unit may include a diffusion sheet 40. The diffusion sheet 40 may cancel or minimize light irradiated from the light source 31. The light irradiated from the light source 31 comes directly into human eyes, making the pattern in which the light source 31 is arranged visible as it is, and hence the diffusion sheet is used to cancel or minimize this effect.

Typically, the diffusion sheet 40 is included in the optical sheet 50 as a part of the optical sheet 50. The diffusion sheet 40 may be provided to diffuse the light irradiated from the light source module 30 to all directions so as to uniformly cast the light in all directions on an image.

The backlight unit may further include a reflector sheet 60 for reflecting light to prevent loss of light. The reflector sheet 60 may reflect light irradiated from the light source 31 to be incident on the diffusion sheet 40. The reflector sheet 60 may have various forms, such as a sheet, a film, a plate, etc. For example, the reflector sheet 60 may be formed by coating a base material with a highly reflective material. SUS, brass, aluminum, PET, etc., may be used for the base material, and silver, $TiO_2$, etc., may be used as a highly reflective coating agent. The reflector sheet 60 may be safely seated and supported on the PCB 32.

The rear cover 90 may cover the edges of the display device 1 while covering the rear side of the bottom chassis 84 as described above. It is not limited thereto, and the edges of the display device 1 may be covered by an additional frame or housing. However, in the following description, it will be assumed that the edges (or frames) of the display device 1 are covered by the rear cover 90.

Moreover, a direct-type display device will be taken as an example in describing the following embodiments of the disclosure, but embodiments of the disclosure are not limited thereto, and may also be applied to an edge-type display device.

The display device 1 may be installed on the wall (a mount type), or placed on the floor with a stand (a stand-type), depending on needs of the user.

On an occasion when a conventional display device is installed on the wall, a stand that otherwise supports the display device needs to be kept somewhere separately, in which case the stand might happen to be lost.

For example, the user may install the display device in the mount-type or the stand-type for the space, and a problem may arise when the installation of the display device is to be changed from the mount-type to the stand-type and the stand having thus far been kept separately is lost.

To solve this problem, the display device 1 according to embodiments of the disclosure may include a stand unit 100 (which has a space which can be referred to as stand compartment) that includes a stand 110 to support the display device 1. The stand unit 100 is coupled with the display device 1 to prevent the problem of losing the stand 110.

Specifically, the display device 1 may include the stand unit 100, and in a case of installing the display device 1 on the wall, the stand 110 is pulled into the display device 1, and in a case of placing the display device 1 on the floor, the stand 110 may be pulled out of the display device 1 to support the display device 1 from the floor.

There may be two stand units 100L and 100R on the left and right of the display device 1. The rear cover 90 may include two through holes, one of which is denoted by 91, for the stand units 100L and 100R to pass through, respectively. The stand units 100L and 100R are arranged in the same configuration on the left and right of the display device 1, so for convenience of explanation, one of the stand units 100L and 100R will be focused to describe the stand unit 100. Moreover, the stand unit 100 is not limited thereto, but may be provided in two or more.

The stand unit 100 of the display device 1 according to a first embodiment of the disclosure will now be described in detail.

Figure 3:
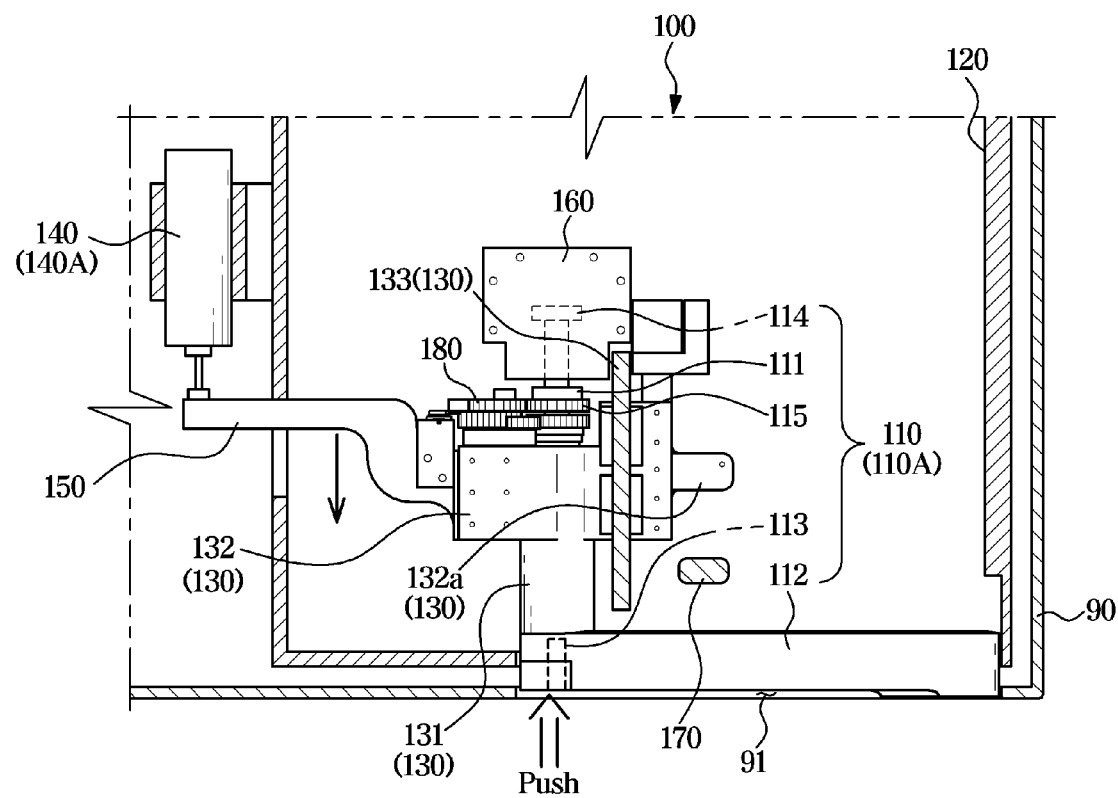
FIG. 3 shows a stand unit of the display device with a stand member pulled in, according to the first embodiment of the disclosure.
Figure 4:
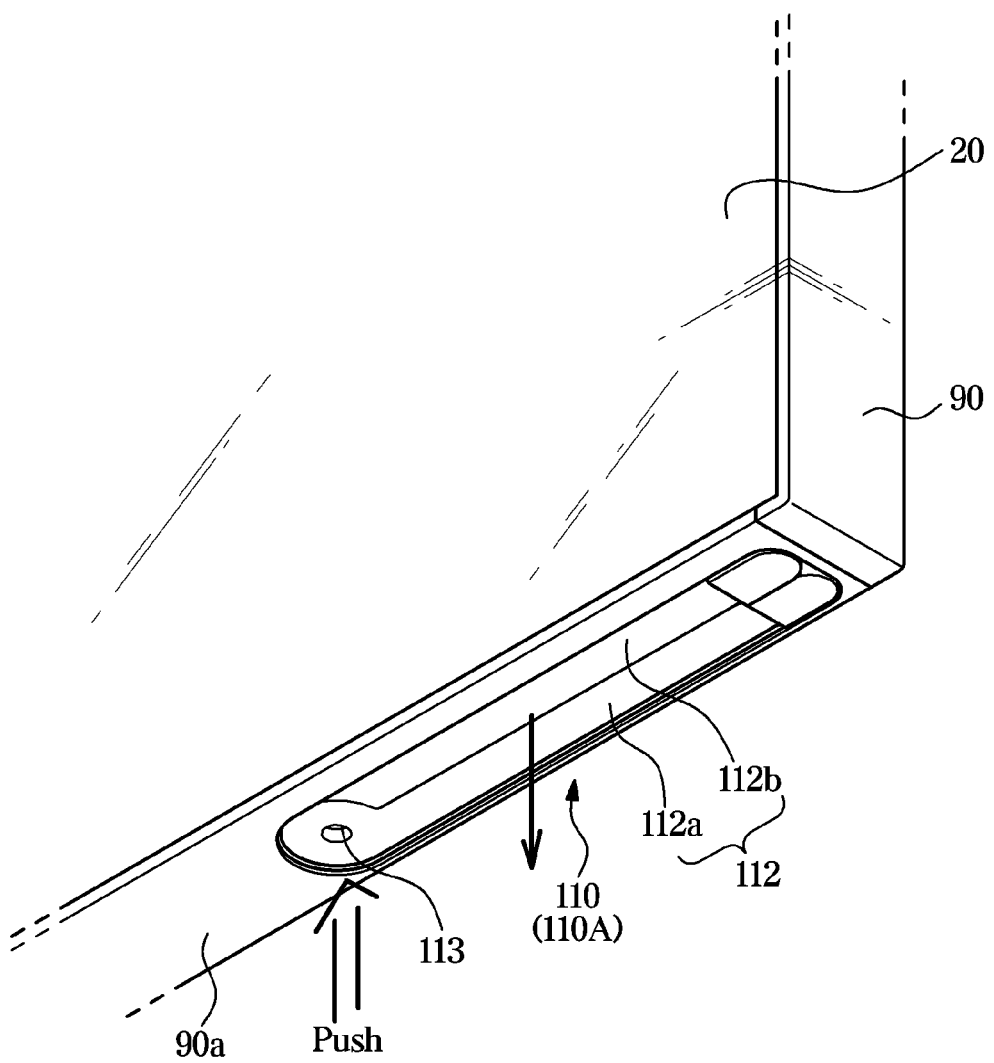
FIG. 4 is a bottom perspective view of the display device with the stand member pulled in, according to the first embodiment of the disclosure.
Figure 5:
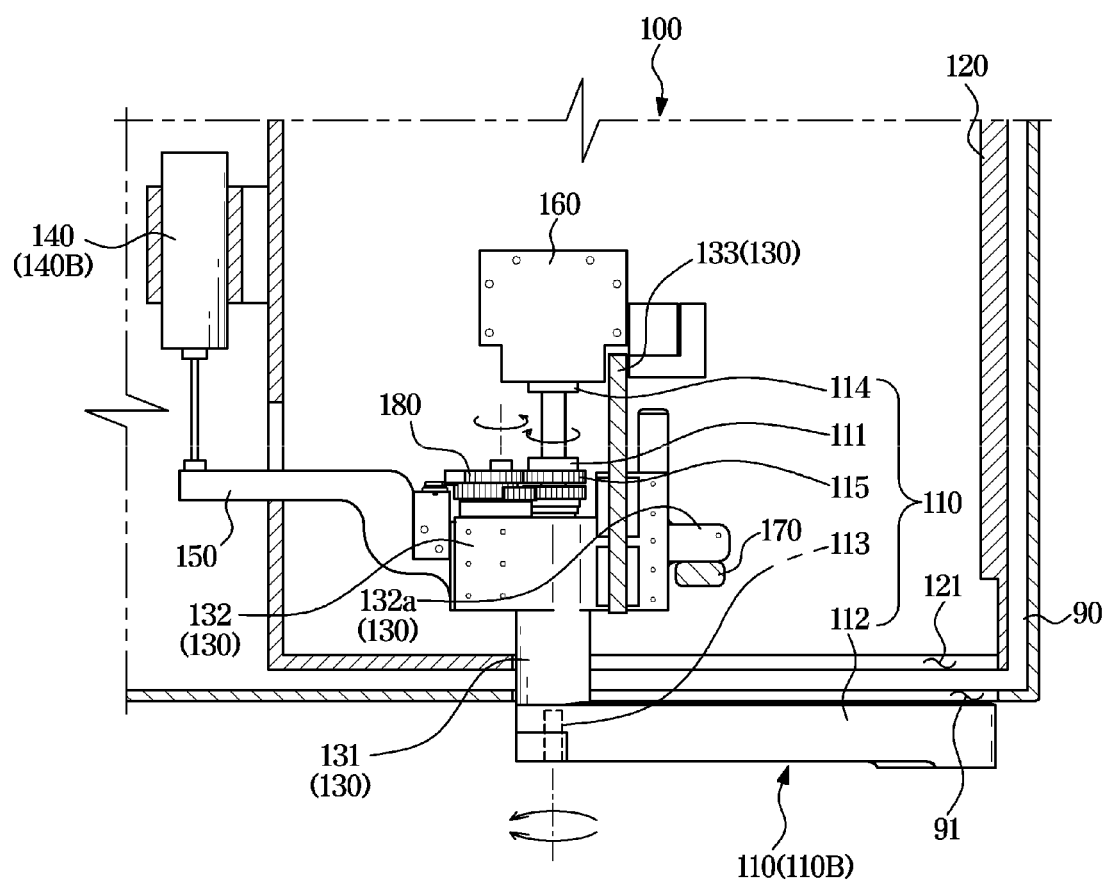
FIG. 5 shows the stand unit of the display device with the stand member partially pulled out, according to the first embodiment of the disclosure.
Figure 6:
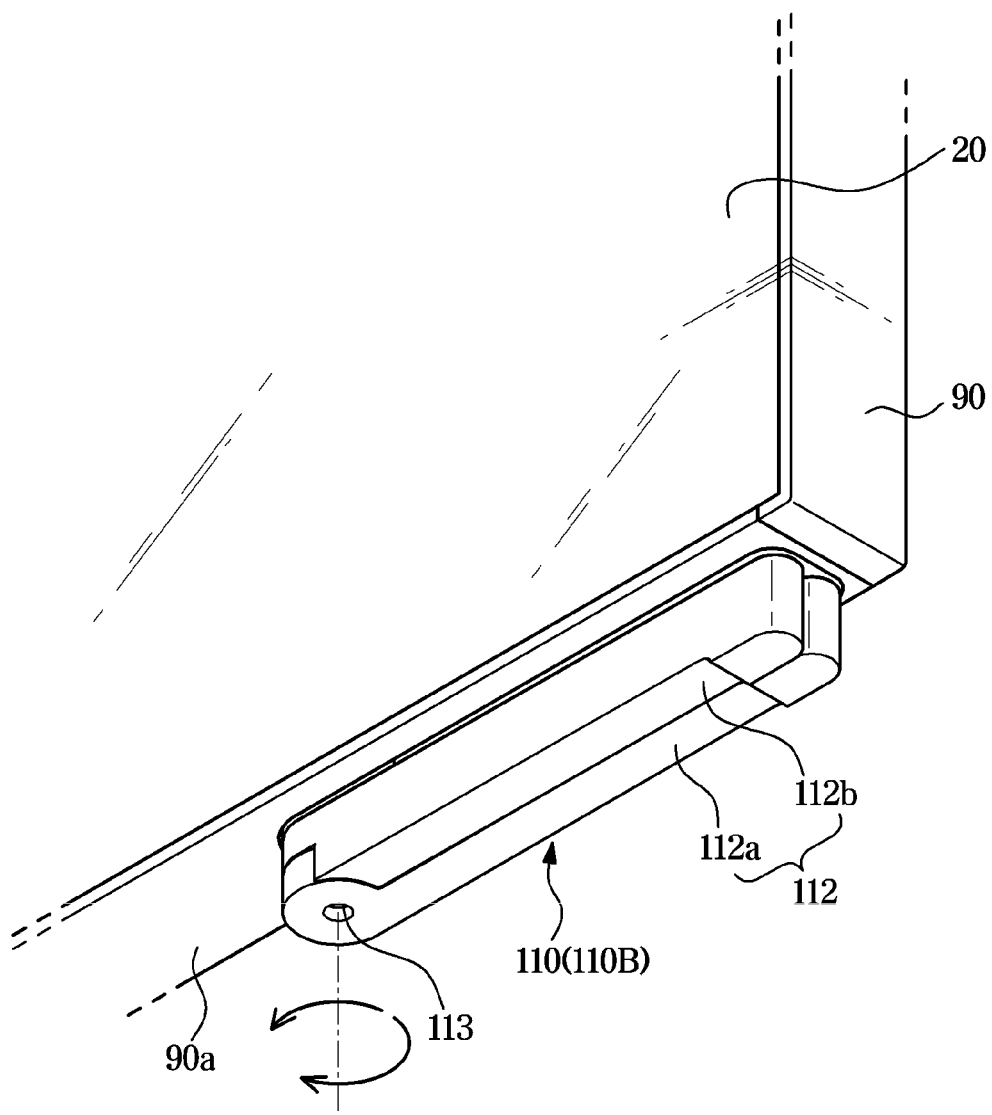
FIG. 6 is a bottom perspective view of the display device with the stand member partially pulled out, according to the first embodiment of the disclosure.
Figure 7:
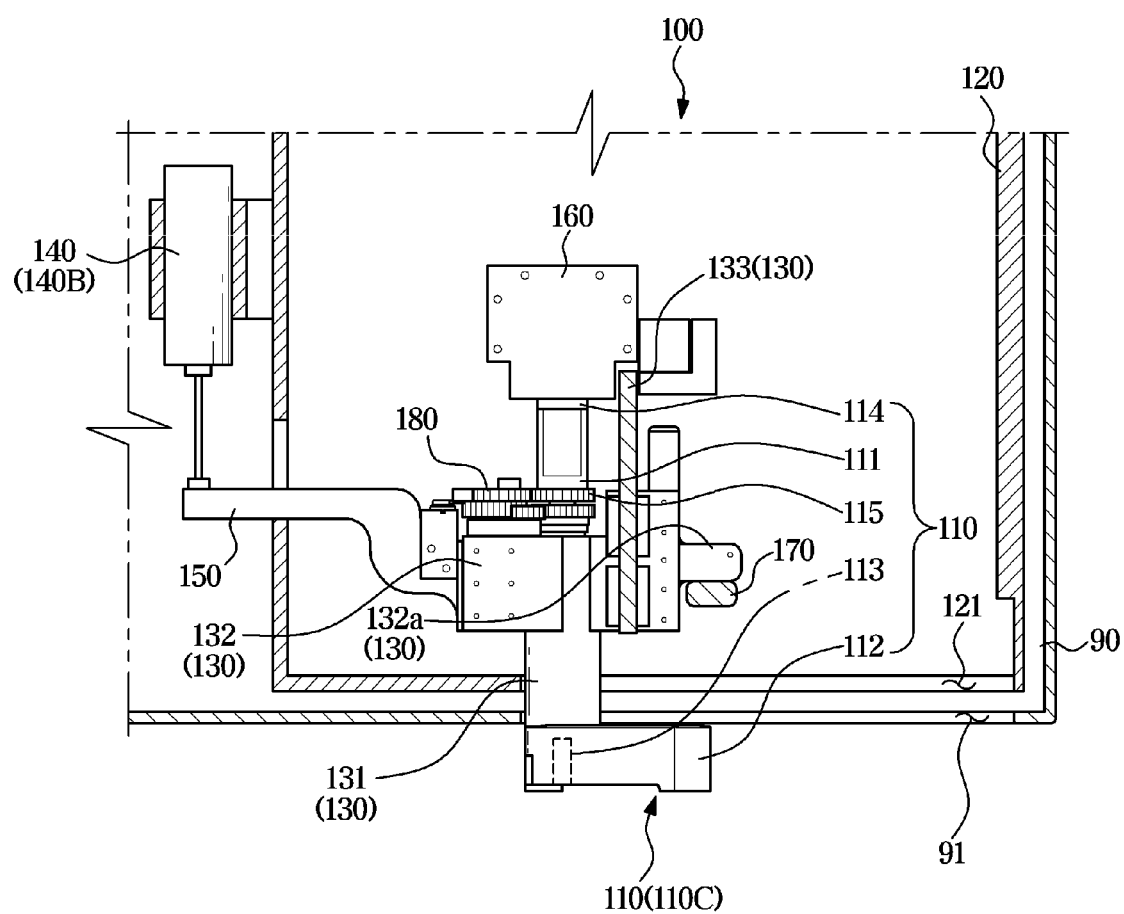
FIG. 7 shows the stand unit of the display device with the stand member fully pulled out, according to the first embodiment of the disclosure.
Figure 8:
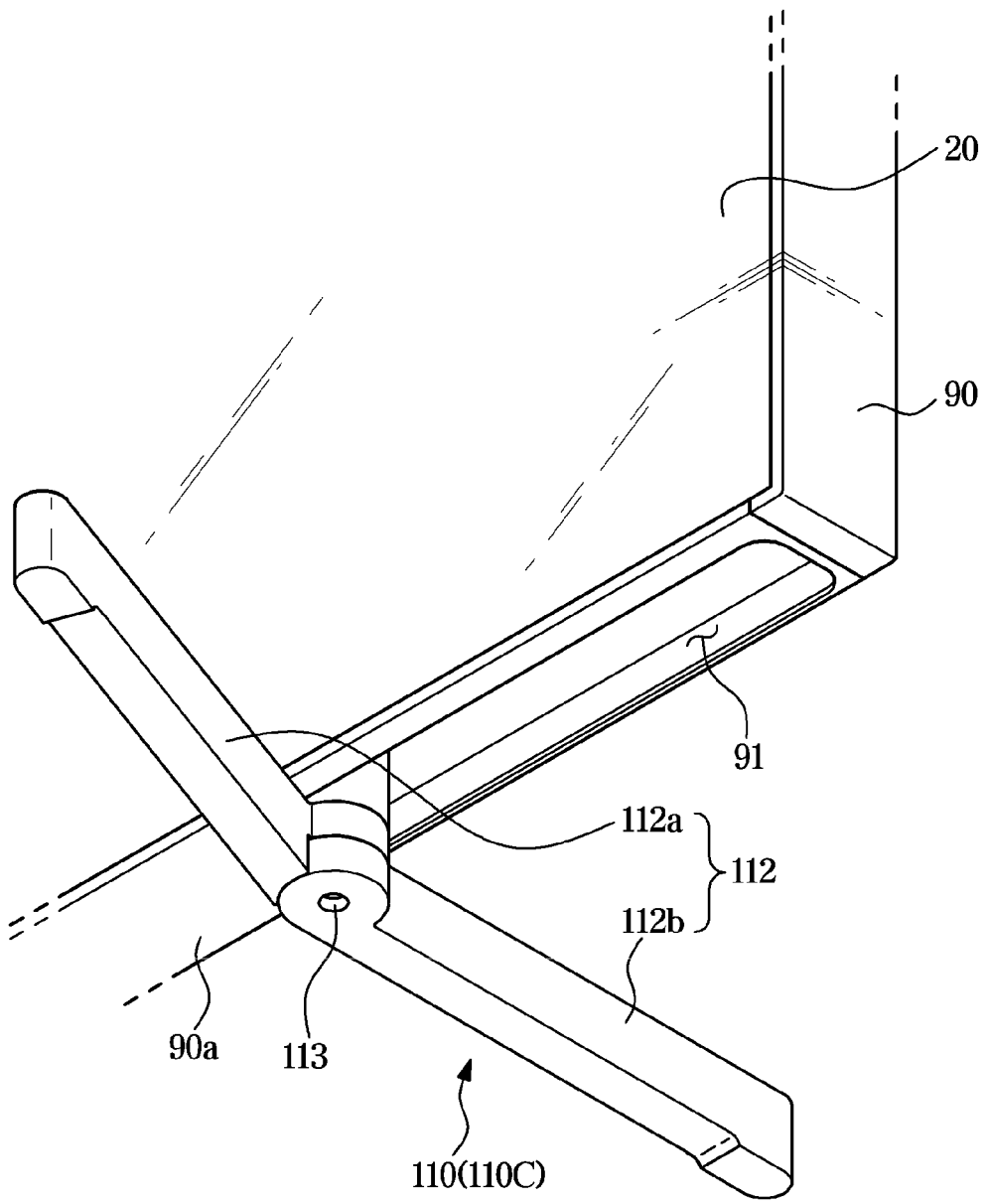
FIG. 8 is a bottom perspective view of the display device with the stand member fully pulled out, according to the first embodiment of the disclosure.

FIG. 3 shows the stand unit of the display device with the stand member pulled in, according to the first embodiment of the disclosure, FIG. 4 is a bottom perspective view of the display device with the stand member pulled in, according to the first embodiment of the disclosure, FIG. 5 shows the stand unit of the display device with the stand member partially pulled out, according to the first embodiment of the disclosure, FIG. 6 is a bottom perspective view of the display device with the stand member partially pulled out, according to the first embodiment of the disclosure, FIG. 7 shows the stand unit of the display device with the stand member fully pulled out, according to the first embodiment of the disclosure, and FIG. 8 is a bottom perspective view of the display device with the stand member fully pulled out, according to the first embodiment of the disclosure.

The stand unit 100 may include a rotation guide for rotating at least a portion of the stand 110 around a rotation shaft.

The rotation guide may be provided for the stand 110 to support the display device 1 by being engaged with the movement of the stand 110 by its self-weight to rotate at least a portion of the stand 110 when the stand 110 is pulled out of the display device 1.

In the first to third embodiments as will be described later, the rotation guide is a general term of a collection of all components to rotate the stand 110 (e.g., an elastic member, a gas cylinder 140, a transmitter 150, a restricting member 215, a guide projection 331, etc.), and in the following description, names of the components of the rotation guide will be mentioned.

The stand unit 100 may be arranged between the bottom chassis 84 and the rear cover 90 (see FIG. 2). For example, the stand unit 100 may be arranged between the bottom chassis 84 and the rear cover 90 in an empty space having no electric parts arranged therein. Furthermore, the stand unit 100 may be coupled onto the rear side of the bottom chassis 84 or the front side of the rear cover 90.

The stand unit 100 may include a case 120 that receives or takes out the stand 110, and a housing 130 fixed to the case 120 for the stand 110 to be pulled in or out of case 120.

The stand unit 100 may also include a locking device 160 to fix the stand 110 by locking the stand 110 to remain in a state of being received in the case 120.

The locking device 160 may be arranged on the top of the stand 110. At least a portion of the stand 110 may be put into and constrained by the locking device 160, and accordingly, the stand 110 may be locked in the locking device 160.

The stand 110 may be locked in the locking device 160 while being received in the case 120.

The locking device 160 may be provided to unlock the stand 110 when the stand 110 is pushed up. In other words, the locking device 160 may lock or unlock the stand 110 based on pushing.

The locking device 160 may be provided in the form of a push locking device such as a ratchet. In the first and other embodiments as will be described later, the locking device is assumed to be a ratchet.

When the stand 110 is released from the locked state, the stand 110 may be moved down by its self-weight. Accordingly, the stand 110 may be pulled out of the case 120.

When the stand 110, which has been pulled out, is pushed up, the stand 10 is moved up again by the external force, and at least a portion of the stand 110 in turn pushes the locking device 160 and accordingly, is constrained back in the locking device 160, ending up with the stand 110 being pulled back into the case 120

In this way, the stand 110 may be moved up or down, and fixed at a particular position by the locking device 160. Specifically, a highest position to which the stand 110 may be moved up may be defined by the locking device 160, and a lowest position to which the stand 10 may be moved down may be defined by a stopper 170, which will be described later.

The stand 110 may then be moved between the highest position and the lowest position. The stand 110 may be vertically moved by a certain distance that is set by the highest and lowest positions.

The case 120 may have the form of a box with six faces, and include an opening 121 on the bottom side that is opened vertically for the stand 110 to be vertically moved through the opening 121.

The opening 121 may be formed to be equal to or greater than the cross-sectional area of a supporting portion 112 of the stand 110 for the supporting portion 112 to pass through the opening 121.

A face of the case 120 is formed to be openable (see FIG. 3), so that the components of the stand unit 100 including the stand 110 may be safely placed inside the case 120. The case 120 is not limited to having the form as in the first embodiment, but may have the form of a quadrangular frame opened to the front and back, in which case the housing 130 may be directly coupled onto the rear side of the bottom chassis 84 or the front side of the rear cover 90. The case 120 still is not limited thereto, but may have any other form.

The housing 130 may be provided for the stand 110 to pass through. The housing 130 may include a movable housing 131 and 132 engaged with the stand 110 to be movable in the vertical direction, and a fixed housing 133 fixed to the case 120.

The movable housing 131 and 132 may be movable against the fixed housing 133, i.e., movable while coupled with the fixed housing 133.

Since the stand 110 may be coupled with the movable housing 131 and 132, it may be movably coupled with the fixed housing 133 through the movable housing 131. Hence, the housing 130 may prevent deviation of the stand 110 from the case 120 while the stand 110 is moving.

The movable housing 131 and 132 may include a stand housing 131 through which the stand 110 passes, and a combining housing 132 with which a gear portion 180 or the transmitter 150, which will be described later, may be coupled.

The stand unit 100 may include the stopper 170 to restrict vertical movement of the stand 110 and the movable housing 131 and 132. The stopper 170 may restrict movements of the stand 110 and the movable housing 131 and 132 so that the stand 110 and the movable housing 131 and 132 may be vertically moved within a certain range.

A contact 132a may be provided in a portion of the movable hosing 131 and 132 for the movable housing 131 and 132 to reach the stopper 170 when moving down a certain distance. Specifically, the contact 132a may be provided to protrude from a side of the combining housing 132 toward a direction in which the stopper 170 extends.

Although not shown, the fixed housing 133 may include a guide (not shown) for guiding the movement of the stand 110 and movable housing 131 and 132. The guide may guide the stand 110 and the movable housing 131 and 132 so that the stand 110 and the movable housing 131 and 132 may be moved straight in the vertical direction.

The stand 110 may be moved down until the contact 132a contacts the stopper 170, and in the state of contact between the stopper 170 and the contact 132a, the stand 110 is restricted by the stopper 170 from moving down.

The stand 110 may include a body portion 111, a locked portion 114 arranged on the top of the body portion 111 and inserted to and constrained by a locking device 160, and the supporting portion 112 provided to be pulled out of the display device 1 when the stand 110 is unlocked and thus to support the display device 110 from the floor.

The stand unit 100 may include a gas cylinder 140 provided to contract or expand by being engaged with vertical movement of the stand 110.

The gas cylinder 140 may transmit force created from the contraction or the expansion to the stand 110 for the supporting portion 112 to be rotated in a state of being pulled from the display device 1. This will be described in more detail later.

The stand unit 100 may include the transmitter 150 for transmitting the force created by the gas cylinder 140 to the stand 110. The stand unit 100 may further include the gear portion 180 driven by the transmitter 150.

Specifically, the force created by the gas cylinder 140 may rotate the gear portion 180 via the transmitter 150.

The stand 110 may include a stand gear 115 arranged in the body portion 111 and is engaged in gear with the gear portion 180. Accordingly, when the gear portion 180 is rotated, the stand gear 115 may be rotated in gear with the gear portion 180, and hence the body portion 111 may be rotated as well.

When the body portion 111 is rotated, the supporting portion 112 arranged beneath and engaged with the body portion 111 is rotated, which will be described later.

A process in which the stand 110 is pulled in or out by the stand unit 100 will now be described in detail.

As shown in FIGS. 3 and 4, when the display device 1 is in a packaged state or installed on the wall in the mount-type, the stand 110 may be placed in a pull-in position 110A.

When the stand 110 is placed in the pull-in position 110A, the movable housing 131 and 132 and the transmitter 150 engaged with the stand 110 may be in positions corresponding to the pull-in position 110A of the stand 110.

The gas cylinder 140 is connected to the transmitter 150, and the gas cylinder 140 may go into a contraction state 140A as the transmitter 150 is in a position corresponding to the highest position of the stand 110.

Specifically, the gas cylinder 140 may contract or expand while the gas cylinder is fixed to the case 120 and a piston of the gas cylinder 140 engaged with the transmitter 150 moves vertically.

When the stand 110 is placed in the pull-in position 110A, it lies inside the case 120 or display device 1 and is not exposed.

A through hole 91 is arranged on the rear side 90a of the rear cover 90 for the stand 110 to pass through in the vertical direction. The through hole 91 may be formed to be equal to or greater than the cross-sectional area of the supporting portion 112 of the stand 110 for the supporting portion 112 to pass through the through hole 91.

A shape of the through hole 91 may match the shape of the supporting portion 112.

When the stand 110 is placed in the pull-in position 110A, it is not pulled out of the through hole 91 and thus, not exposed, but it is possible for the user to push the stand 110 upward through the through hole 91 from the outside.

The user may push the stand 110 upward to pull the stand 110 out of the display device 1.

When the stand 110 is pushed up, the locked portion 114 inserted to the locking device 160 may be moved up to push the locking device 160 from inside the locking device 160.

As the locking device 160 is pushed, the locked portion 114 may be unlocked, and the stand 110 may be unlocked accordingly.

The stand 110 may move down by its self-weight.

As shown in FIGS. 5 and 6, the stand 110 and the movable housing 131 and 132 may move down by their self-weights, and accordingly, the supporting portion 112 may pass through the opening 121 of the case 120 and the through hole 91 of the rear cover 90 and may be pulled down from the display device 1.

Hence, the stand 110 may be placed in a middle position 110B by moving down from the pull-in position 110A.

As described above, the movable housing 131 and 132, and the transmitter 150 and gear portion 180 coupled with the combining housing 132 may also be engaged and moved down with the stand 110.

As the transmitter 150 is moved down, the piston of the gas cylinder 140 engaged with the transmitter 150 is moved down, and hence, the gas cylinder 140 may go into the expansion state B.

The supporting portion 112 may include a first supporter 112a and a second supporter 112b.

The stand 110 may include a rotation shaft 113 provided for the first and second supporters 112a and 112b to be rotated around.

The rotation shaft 113 may extend in an extending direction of the stand 110, and may be arranged in the extending direction of the stand 110.

The first and second supporters 112a and 112b may be each provided to be rotational around the rotation shaft 113. Since the rotation shaft 113 vertically extends in the extending direction of the stand 110, as described above, the first and second supporters 112a and 112b may be rotated horizontally.

When the stand 110 is placed in the pull-in position 110A, the first and second supporters 112a and 112b may be put into the through hole 91 and the opening 121 while contacting each other.

As described above, the through hole 91 or the opening 121 is formed to have a shape matching the shape of the supporter 112 and have a cross section in a similar size to the supporter 112, so that the through hole 91 or the opening 121 may keep the first and second supporters 112a and 112b in the state of contacting each other.

In this case, horizontal rotation of the first or second supporter 112a or 112b around the rotation shaft 113 may be restricted by the through hole 91 or the opening 121.

On the other hand, when the stand 110 is placed in the middle position 110B, the supporting portion 112 is pulled from the through hole 91 and the opening 121, and the first and second supporters 112a and 112b may be rotated without restriction.

Hence, when the stand 110 is placed in the middle position 110B, the first and second supporters 112a and 112b may go into a rotational state.

Since the gas cylinder 140 is in the expansion state B, the gas cylinder 140 creates force by contraction and expansion, and the force may drive the gear portion 180 via the transmitter 150.

As the gear portion 180 is driven, the stand gear 115 in gear with the gear portion 185 may be rotated, and the body portion 111 may be rotated by being engaged with the rotation with the stand gear 115.

The supporting portion 112 coupled with the body portion 111 may be engaged with rotation of the body portion 111 for the first and second supporters 112a and 112b to be rotated in opposite directions.

The gear portion 180 may control rotation speed of the first and second supporters 112a and 112b. Specifically, a plurality of gears are arranged in the gear portion 180, and the rotation speed of the first and second supporters 112a and 112b may be controlled appropriately based on the size or arrangement of each of the gears.

Furthermore, the gear portion 180 may help the supporting portion 112 rotate stably, and, as described above, control the rotation speed, thereby increasing reliability and beauty of the supporting portion 112 when the supporting portion 112 is rotated.

Although not shown, the stand 110 may include an elastic member provided to rotate the first and second supporters 112a and 112b.

The elastic member may be provided to rotate the first and second supporters 112a and 112b in opposite directions when the stand 110 is placed in the middle position 110B by pushing the first and second supporters 112a and 112b in the opposite directions.

The elastic member may be formed with a member such as a torsion spring.

Even when the elastic member pushes each of the first and second supporters 112a and 112b when the stand 110 is placed in the pull-in position 110A, the supporters 112a and 112b are not rotated but contained in the case 120 while staying in contact with each other because the supporting portion 112 is received in the through hole 91 or opening 121 as described above.

When the stand 110 is placed in the middle position 110B, the elastic member may push the first and second supporters 112a and 112b to rotate them.

The elastic member may be arranged to apply torque onto the first and second supporters 112a and 112b around the rotation shaft 113 as a rotation axis.

When elastic force of the elastic member is enough to push the first and second supporters 112a and 112b, the stand unit 100 may not include some components such as the aforementioned gas cylinder 140 and transmitter 150.

The stand unit 100 may rotate the supporting portion 112 simply with the elastic member.

The stand unit 100 is not limited to what is described in the first embodiment, and may rotate the supporting portion 112 just with the force of the gas cylinder 140.

Referring to FIGS. 7 and 8, rotation force is applied to the supporting portion 112 and the first and second supporters 112a and 112b are rotated in opposite directions until placed in front and back of the display device 1, respectively.

The position of the stand 110 may be changed by rotation of the first and second supporters 112a and 112b from the middle position 110B to a supporting position 110C.

As the first and second supporters 112a and 112b are rotated around the rotation shaft 113 in opposite directions, the first and second supporters 112a and 112b may form a shape spreading around the rotation shaft 113.

Accordingly, the first supporter 112a may be placed in front of the display device 1, and the second supporter 112b may be placed in the back of the display device 1.

As the stand 110 is placed in the supporting position 110C, the supporting portion 112 may support the display device 1 from front and back, thereby placing the display device 1 stably on the floor with the stand 110 when the display device 1 is installed in the stand-type.

In other words, the display device 1 may be supported on the floor in the stand-type with the stand 110 pulled out and placed in the supporting position 110C, and the display device 1 may be supported on the wall in the mount-type by pulling the stand 110 into the display device 1 in the pull-in position 110A.

The user may pull the stand 110 back into the display device 1 from the supporting position 110C by reversing the aforementioned process.

Specifically, the user may push the unfolded first and second supporters 112a and 112b in the supporting position 110C to be folded together, and push the supporting portion 112 upward to move the stand 110 upward, thereby forcing the locked portion 114 of the stand 110 to be inserted back into the locking device 160 and constrained by the locking device 160.

When the stand 110 is locked in the locking device 160, the stand 110 is placed back in the pull-in position 110A and not exposed.

In this way, the stand unit 100 may selectively pull the stand 110 into or out of the display device 1. Accordingly, even in a situation where the display device 1 is to be installed in the mount-type that does not require the stand 110, the stand 110 may be pulled into the display device 1, thereby eliminating the need to keep the stand 110 separately and concerns about losing the stand 110.

Furthermore, as described above, the user may pull the stand 110 out of the display device 1 by simply pushing the inner side of the through hole 91 formed at the bottom of the display device 1.

When the conventional display device is placed in the stand-type, the display device needs to be held by something or be laid on the floor to attach a stand onto the display device. After the stand is attached onto the display device, the user needs to hold and stand the display device on the floor in the stand-type.

On the contrary, the display device 1 according to the first embodiment of the disclosure may be easily installed on the floor with the stand unit 100 that allows the user to pull a stand out of the display device 1 by pushing the bottom of the display device 1 while holding the display device 1.

A second embodiment of the disclosure will now be described. Description of overlapping components with those of the first embodiment will not be repeated.

Figure 9:
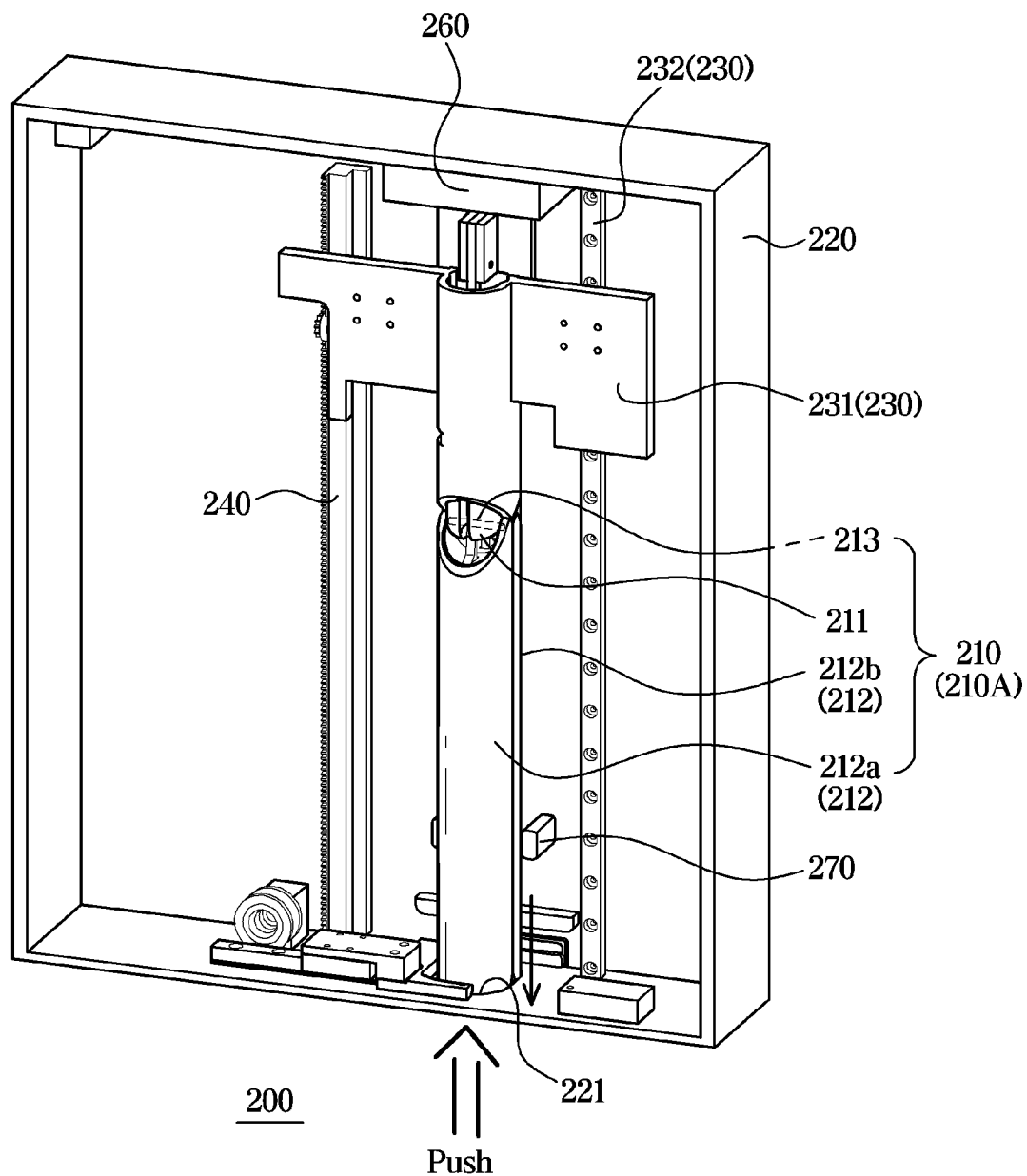
FIG. 9 shows a stand unit of a display device with a stand member pulled in, according to a second embodiment of the disclosure.
Figure 10:
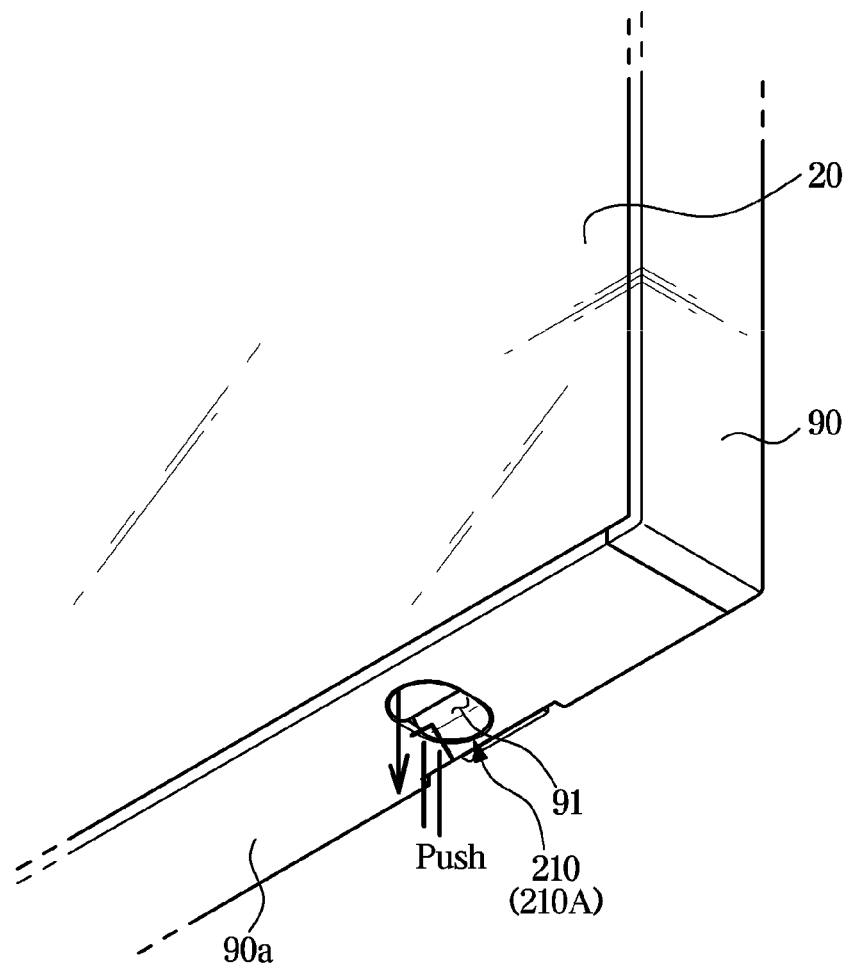
FIG. 10 is a bottom perspective view of the display device with the stand member pulled in, according to the second embodiment of the disclosure.
Figure 11:
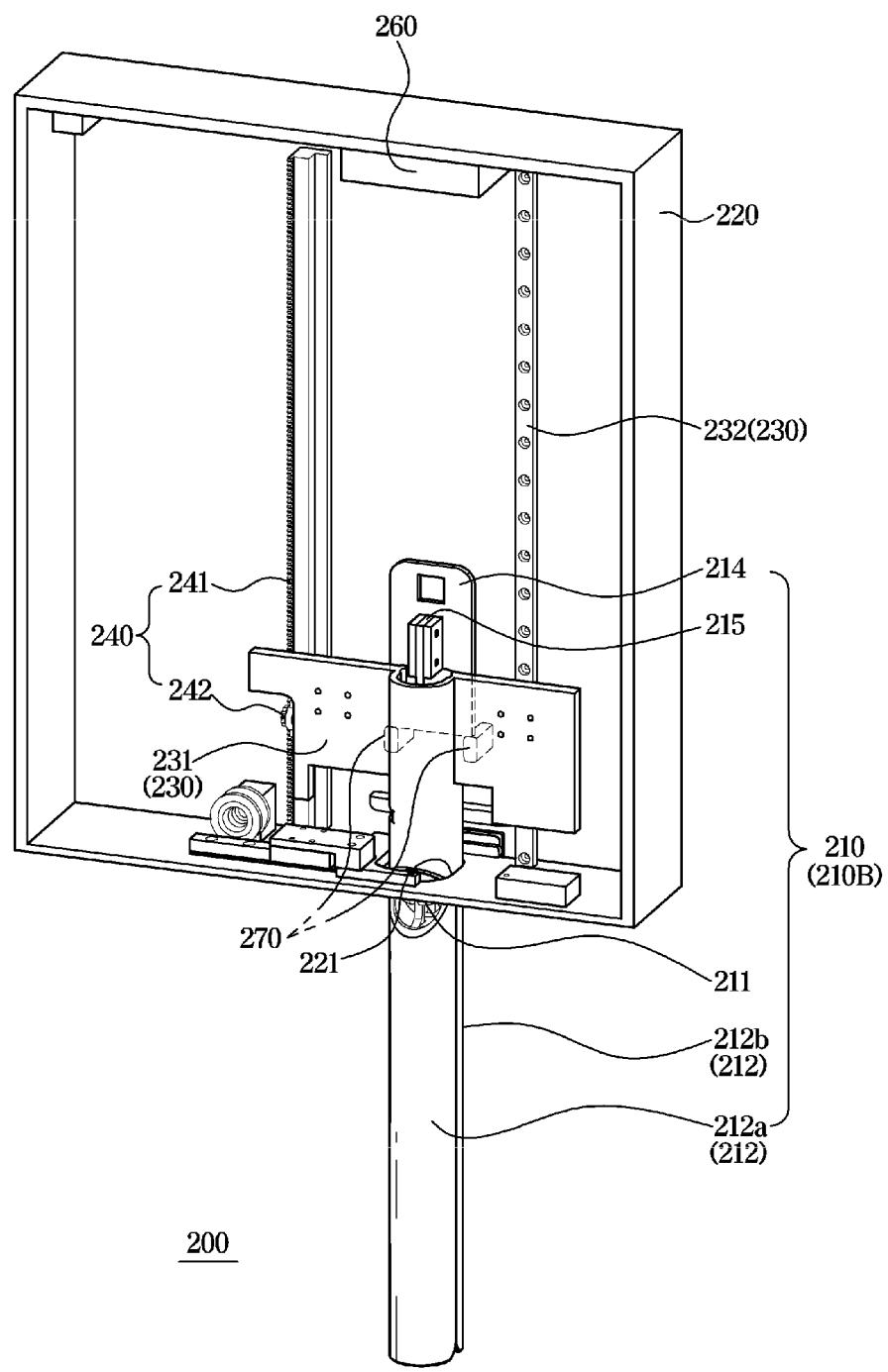
FIG. 11 shows the stand unit of the display device with the stand member partially pulled out, according to the second embodiment of the disclosure.
Figure 12:
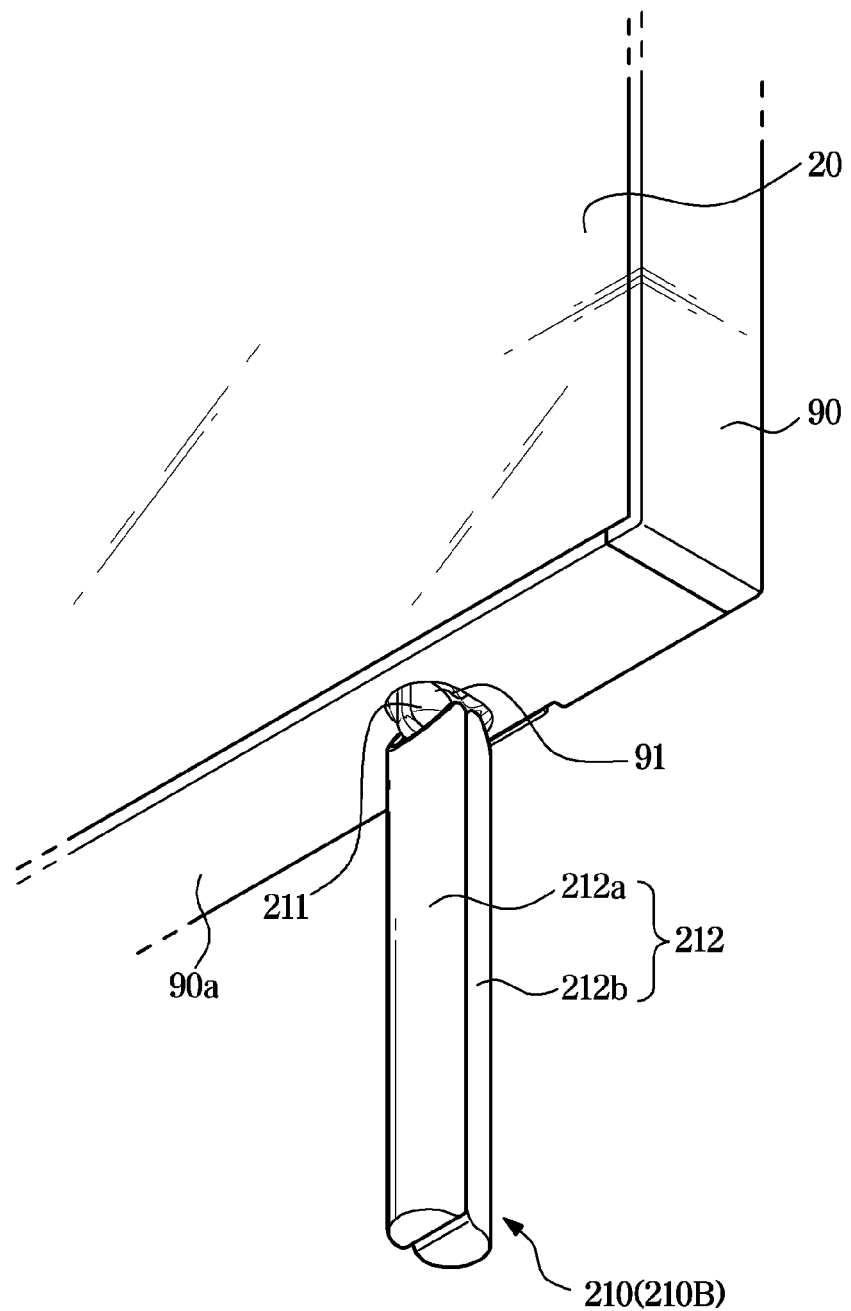
FIG. 12 is a bottom perspective view of the display device with the stand member partially pulled out, according to the second embodiment of the disclosure.
Figure 13:
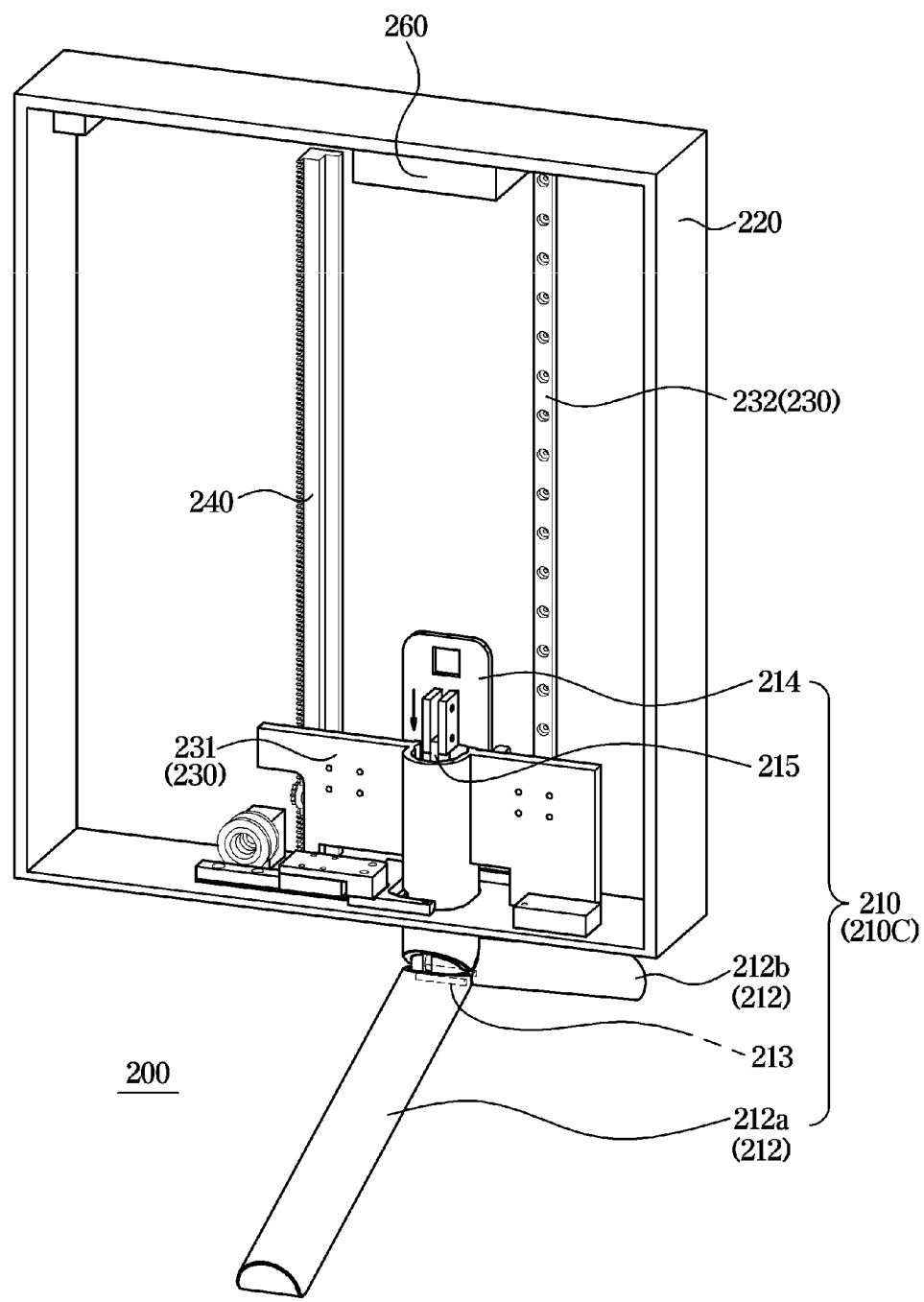
FIG. 13 shows the stand unit of the display device with the stand member fully pulled out, according to the second embodiment of the disclosure.
Figure 14:
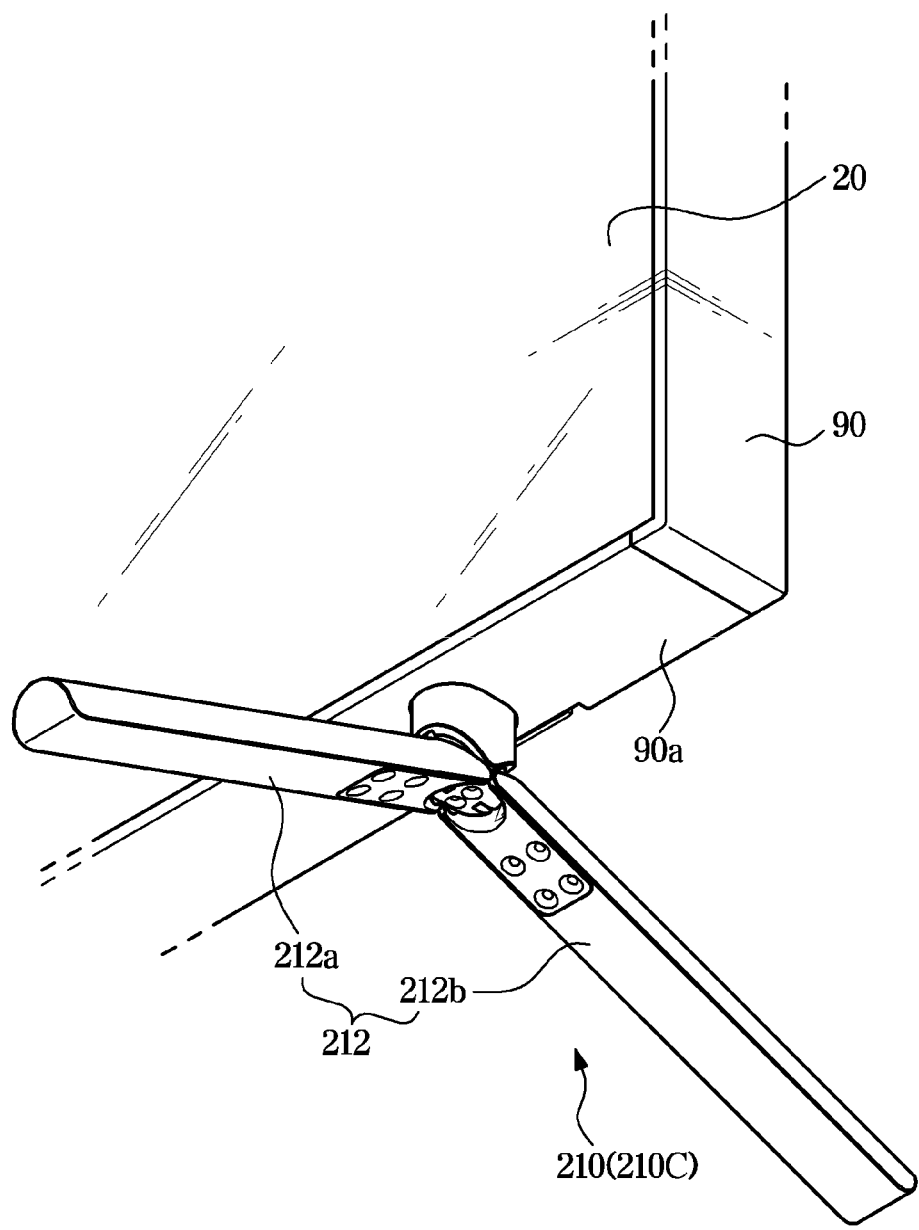
FIG. 14 is a bottom perspective view of the display device with the stand member fully pulled out, according to the second embodiment of the disclosure.

FIG. 9 shows a stand unit of a display device with a stand member pulled in, according to a second embodiment of the disclosure, FIG. 10 is a bottom perspective view of the display device with the stand member pulled in, according to the second embodiment of the disclosure, FIG. 11 shows the stand unit of the display device with the stand member partially pulled out, according to the second embodiment of the disclosure, FIG. 12 is a bottom perspective view of the display device with the stand member partially pulled out, according to the second embodiment of the disclosure, FIG. 13 shows the stand unit of the display device with the stand member fully pulled out, according to the second embodiment of the disclosure, and FIG. 14 is a bottom perspective view of the display device with the stand member fully pulled out, according to the second embodiment of the disclosure.

In the second embodiment, a stand unit 200 may include a stand 210 provided to be movable in the vertical direction, a case 220, and a housing 230 fixed to the case 220 to pull the stand 210 in or out of the case 220.

The stand unit 200 may also include a locking device 260 to fix the stand 210 by locking the stand 210 to remain in a state of being received in the case 220.

The locking device 260 may be arranged on the top of the stand 210. At least a portion of the stand 210 may be put into and constrained by the locking device 260, and accordingly, the stand 210 may be locked in the locking device 260.

When the stand 210 is released from the locked state, the stand 210 may be moved down by its self-weight. Accordingly, the stand 210 may be pulled out of the case 220.

When the stand 210, which has been pulled out, is pushed up, the stand 10 is moved up again by the external force, and at least a portion of the stand 210 in turn pushes the locking device 260 and accordingly, is constrained back in the locking device 260, ending up with the stand 210 being pulled back into the case 220.

In this way, the stand 210 may be moved up or down, and fixed at a particular position by the locking device 260. Specifically, a highest position to which the stand 210 may be moved up may be defined by the locking device 260, and a lowest position to which the stand 10 may be moved down may be defined by a stopper 270.

The stand 110 may then be moved between the highest position and the lowest position. The stand 110 may be vertically moved by a certain distance that is set by the highest and lowest positions.

The housing 230 may include a movable housing 231 through which the stand 210 passes and which is engaged with the stand 210 to be movable in the vertical direction, and a fixed housing 232 fixed to the case 220.

The movable housing 231 may be movable against the fixed housing 232, i.e., movable in a state of being coupled with the fixed housing 232.

The stand unit 200 may further include a guide 240 for guiding vertical movement of the stand 210 and the movable housing 231.

The guide 240 may include a rack 241 extending vertically, and a pinion 242 coupled in gear with the rack 241 and arranged in the movable housing 231.

As the pinion is moved along the rack 241 that extends vertically, the movable housing 231 coupled to the pinion 242 and the stand 210 coupled to the movable housing 231 may be stably moved in the vertical direction.

The stand 210 may include a body portion 211, a locked portion 214 arranged on the top of the body portion 211 and inserted to and constrained by a locking device 260, and the supporting portion 212 provided to be pulled out of the display device 1 when the stand 210 is unlocked and thus to support the display device 1 from the floor.

The stand 210 may include a restricting member 215 for constraining the supporting portion 212. When the stand 210 is pulled out of the display device 1, the restricting member 215 may release the supporting portion 212 from the constraint to be unfolded. When the stand 210 is moved inside the display device 1, the restricting member 215 may constrain the supporting portion 212 for the stand 210 to be stably moved inside the display device 1.

A process in which the stand 210 is pulled in or out by the stand unit 200 will now be described in detail.

As shown in FIGS. 9 and 10, when the display device 1 is in a packaged state or installed on the wall in the mount-type, the stand 210 may be placed in a pull-in position 210A.

When the stand 210 is placed in the pull-in position 210A, the movable housing 231 engaged with the stand 210 may be in a position corresponding to the pull-in position 210A of the stand 110.

When the stand 210 is placed in the pull-in position 210A, it lies inside the case 220 or display device 1 and is not exposed.

When the stand 210 is placed in the pull-in position 210A, it is not pulled out of the through hole 91 and thus, not exposed, but it is possible for the user to push the stand 210 upward through the through hole 91 from the outside.

The user may push the stand 210 upward to pull the stand 210 out of the display device 1.

When the stand 210 is pushed up, the locked portion 214 inserted to the locking device 260 may be moved up to push the locking device 260 from inside the locking device 260.

As the locking device 260 is pushed, the locked portion 214 may be unlocked, and the stand 210 may be unlocked accordingly.

The stand 210 may move down by its self-weight.

As shown in FIGS. 11 and 12, the stand 210 and the movable housing 231 may move down by their self-weights, and accordingly, the supporting portion 212 may pass through an opening 221 of the case 220 and the through hole 91 of the rear cover 90 and may be pulled down from the display device 1.

Hence, the stand 210 may be placed in a middle position 210B by moving down from the pull-in position 210A.

The supporting portion 212 may include a first supporter 212a and a second supporter 212b. The first supporter 212a may be placed in front of the display device 1, and the second supporter 212b may be placed in the back of the display device 1.

The stand 210 may include a rotation shaft 213 provided for the first and second supporters 212a and 212b to be rotated around.

The rotation shaft 213 may extend in a direction parallel to the length of the display device 1. Specifically, the rotation shaft 213 may extend in the horizontal direction of the display device 1 and may be arranged in the horizontal direction of the display 1.

The first and second supporters 212a and 212b may be each provided to be rotational around the rotation shaft 213. Since the rotation shaft 213 extends in the horizontal direction of the display device 1, as described above, the first and second supporters 212a and 212b may be turned to the front and back with respect to the horizontal direction of the display device 1.

Specifically, the first supporter 212a may be turned to the front of the display device 1, and the second supporter 212b may be turned to the back of the display device 1.

When the stand 210 is placed in the pull-in position 210A, the first and second supporters 212a and 212b may be put into the through hole 91 and the opening 121 while contacting each other. The through hole 91 or the opening 121 may keep the first and second supporters 212a and 212b in the state of contacting each other.

On the other hand, when the stand 210 is placed in the middle position 210B, the supporting portion 212 is pulled from the through hole 91 and the opening 121, and the first and second supporters 212a and 212b may be rotated without restriction.

Hence, when the stand 210 is placed in the middle position 210B, the first and second supporters 212a and 212b may go into a rotational state.

Although not shown, the stand 210 may include an elastic member provided to rotate the first and second supporters 212a and 212b.

The elastic member may be provided to rotate the first and second supporters 212a and 212b in opposite directions when the stand 210 is placed in the middle position 210B by pushing the first and second supporters 212a and 212b in the opposite directions.

The elastic member may be formed with a member such as a torsion spring.

Even when the elastic member pushes each of the first and second supporters 212a and 212b when the stand 210 is placed in the pull-in position 210A, the first and second supporters 212a and 212b are not rotated but contained in the case 220 while staying in contact with each other because the supporting portion 212 is received in the through hole 91 or opening 121 as described above.

When the stand 210 is placed in the middle position 210B, the elastic member may push the first and second supporters 212a and 212b to be rotated.

The elastic member may be arranged to be able to apply torque onto the first and second supporters 212a and 212b around the rotation shaft 213 as a rotation axis.

The stand 210 may include a restricting member 215 to constrain the first and second supporters 212a and 212b. The restricting member 215 may restrict the first and second supporters 212a and 212b from being rotated by the elastic member at the pull-in position 210A or the middle position 210B.

Specifically, while the stand 210 is moving between the pull-in position 210A and the middle position 210B, the restricting member 215 may constrain the first and second supporters 212a and 212b for the stand 210 to be moved stably.

Although not shown, the restricting member 215 is provided to be hooked with the first and second supporters 212a and 212b inside the body portion 211. It is not, however, limited thereto, but the restricting member 215 may be provided in various forms to constrain or release the first and second supporters 212a and 212b.

The stand unit 200 is not limited to the second embodiment, but may further include a gas cylinder to push the supporting portion 212 to rotate the first and second supporters 212a and 212b.

The gas cylinder's main body may be fixed to the case 220 and a piston of the gas cylinder may be engaged with the movable housing 231 to be moved.

Accordingly, the gas cylinder may contract or expand as the stand 210 and the movable housing 231 are moved vertically, and the force created from the contraction or expansion may be transmitted to the supporting portion 212 to rotate each of the first and second supporters 212a and 212b.

With the gas cylinder included in the stand unit 200, the elastic member may not be included in the stand unit 200.

The guide 240 may guide the moving direction of the stand 210 through the rack 241 and the pinion 242 and simultaneously, control the moving speed of the stand 210. For example, the speed at which the stand 210 moves up or down may be controlled by adjusting the size or arrangement of the rack 241 and pinion 242.

Furthermore, the guide 240 may be provided to allow the stand 210 to be stably moved in gear with the rack 241 and the pinion 242, and may increase reliability and beauty of the stand 210 by controlling the rising or falling speed as described above.

Referring to FIGS. 13 and 14, rotation force is applied to the supporting portion 212 and the first and second supporters 212a and 212b are rotated in opposite directions until placed in front and back of the display device 1, respectively.

When the movable housing 231 is restricted by the stopper 270 from moving downward, the body portion 211 of the stand 210 that is moved by being engaged with the movable housing 231 may be restricted from moving as well.

The restricting member 215 arranged inside the body portion 211 is not constrained by this but may be moved by its self-weight further down than the body portion 211 is.

The restricting member 215 may vertically slide in the body portion 211. The restricting member 215 may be moved down and constraints of the restricting member 215 on the first and second supporters 212a and 212b may be released.

The restricting member 215 releases constraints on the first and second supporters 212a and 212b in a position at which the movable housing 231 is restricted by the stopper 270 from moving, and hence the first and second supporters 212a and 212b are rotated for the stand 210 to be finally in the supporting position 210C.

As the first and second supporters 212a and 212b are rotated around the rotation shaft 213 in opposite directions, the first and second supporters 212a and 212b may form a shape spreading around the rotation shaft 213.

Accordingly, the first supporter 212a may be placed in front of the display device 1, and the second supporter 212b may be placed in the back of the display device 1.

A third embodiment of the disclosure will now be described. Description of overlapping components with those of the previous embodiments will not be repeated.

Figure 15:
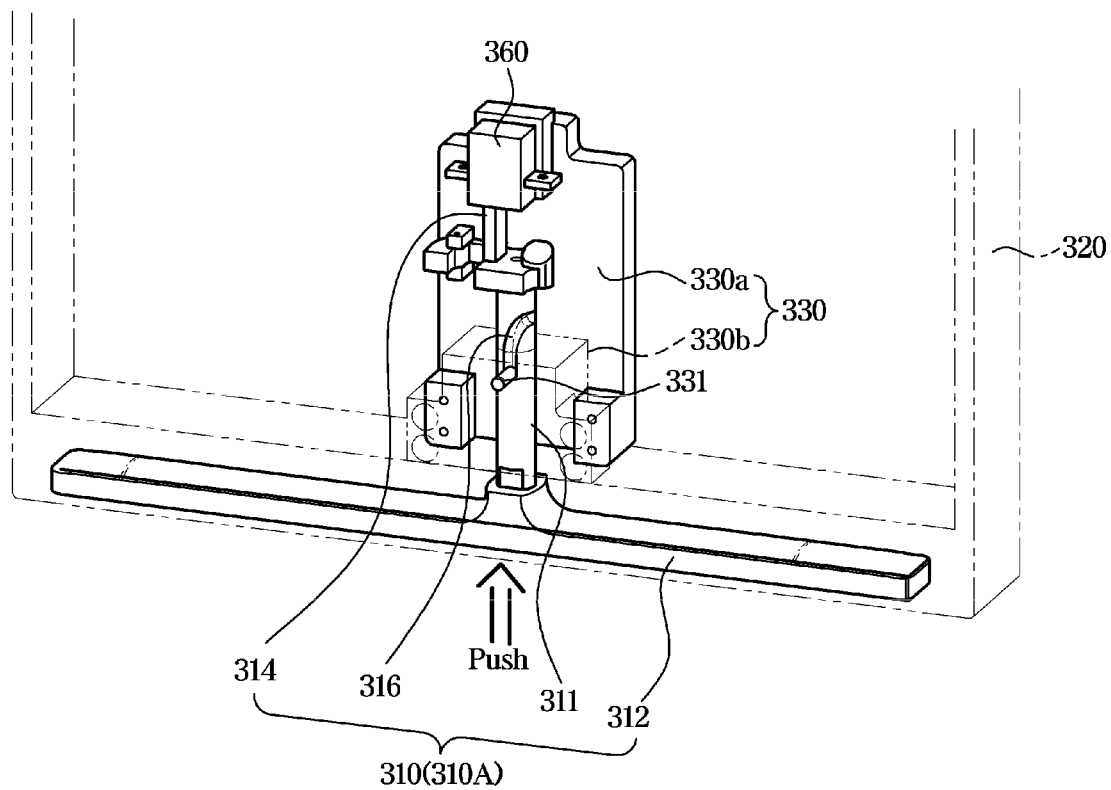
FIG. 15 shows a stand unit of a display device with a stand member pulled in, according to a third embodiment of the disclosure.
Figure 16:
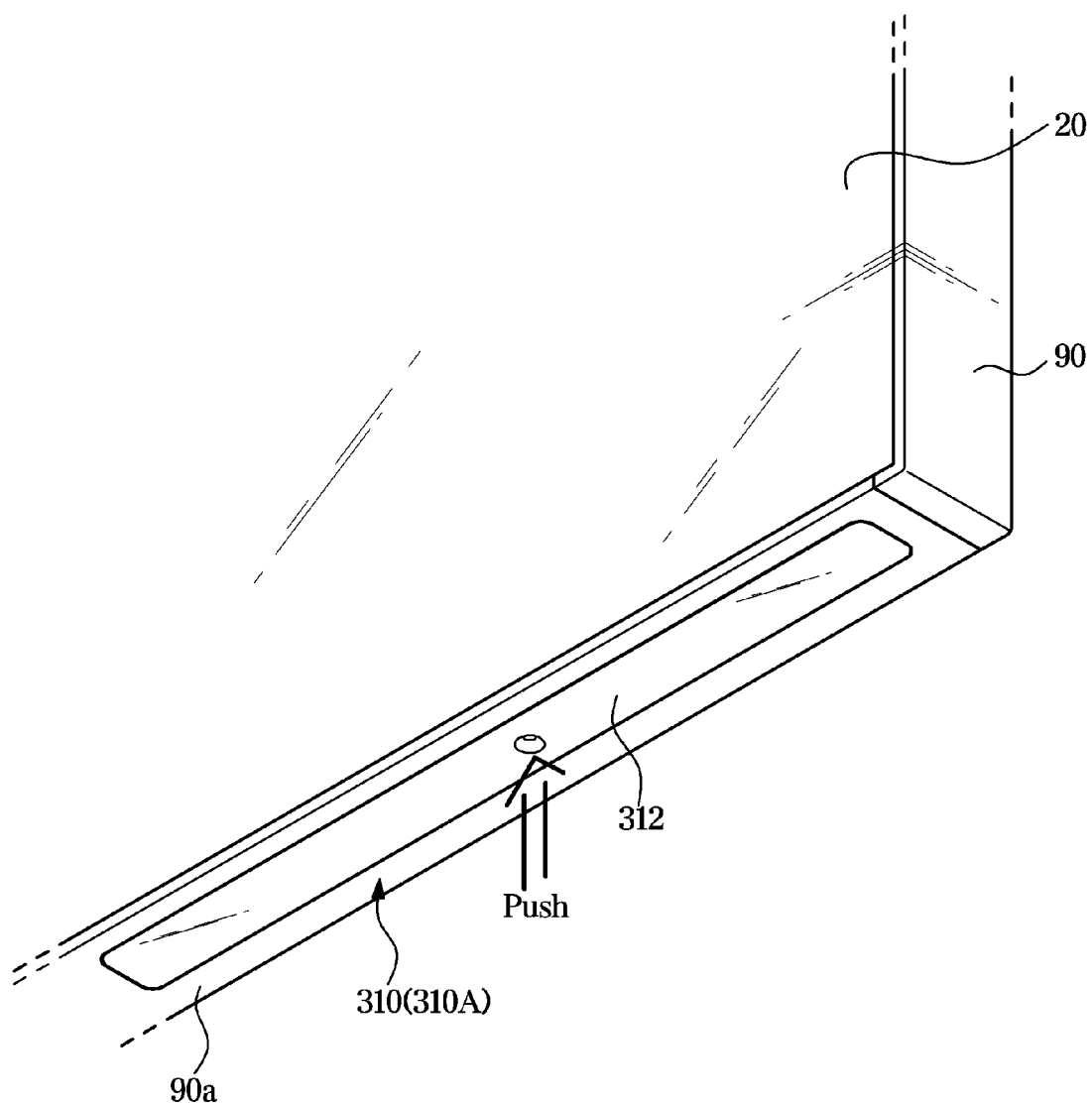
FIG. 16 is a bottom perspective view of the display device with the stand member pulled in, according to the third embodiment of the disclosure.
Figure 17:
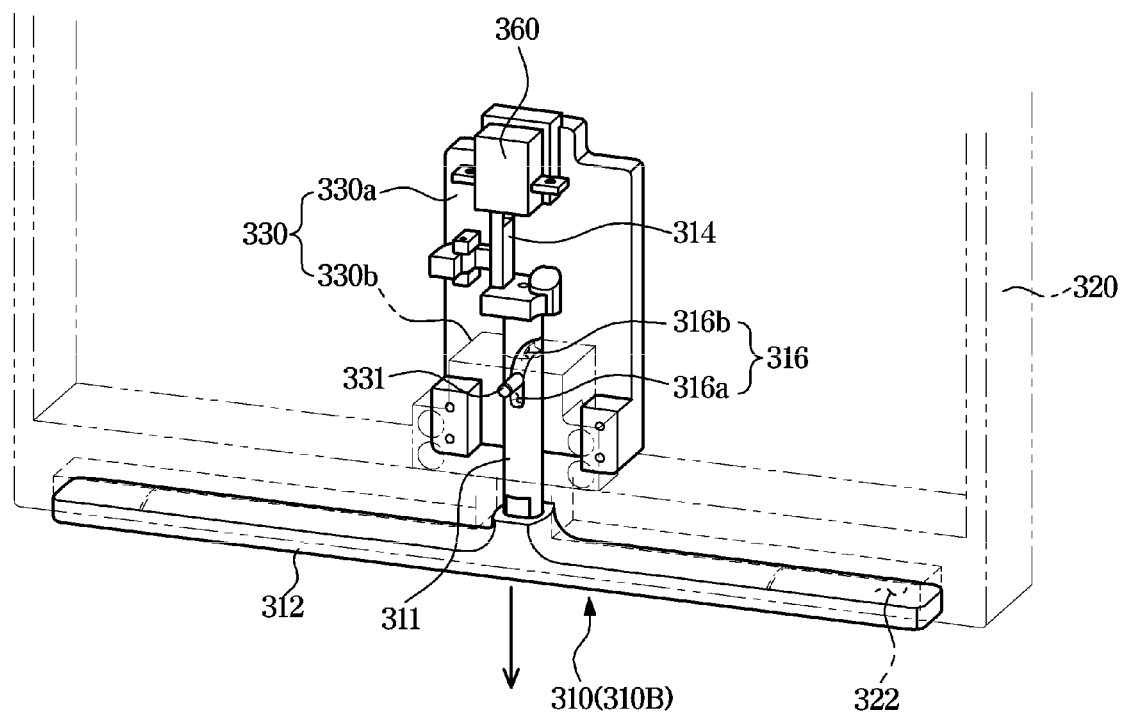
FIG. 17 shows the stand unit of the display device with the stand member partially pulled out, according to the third embodiment of the disclosure.
Figure 18:
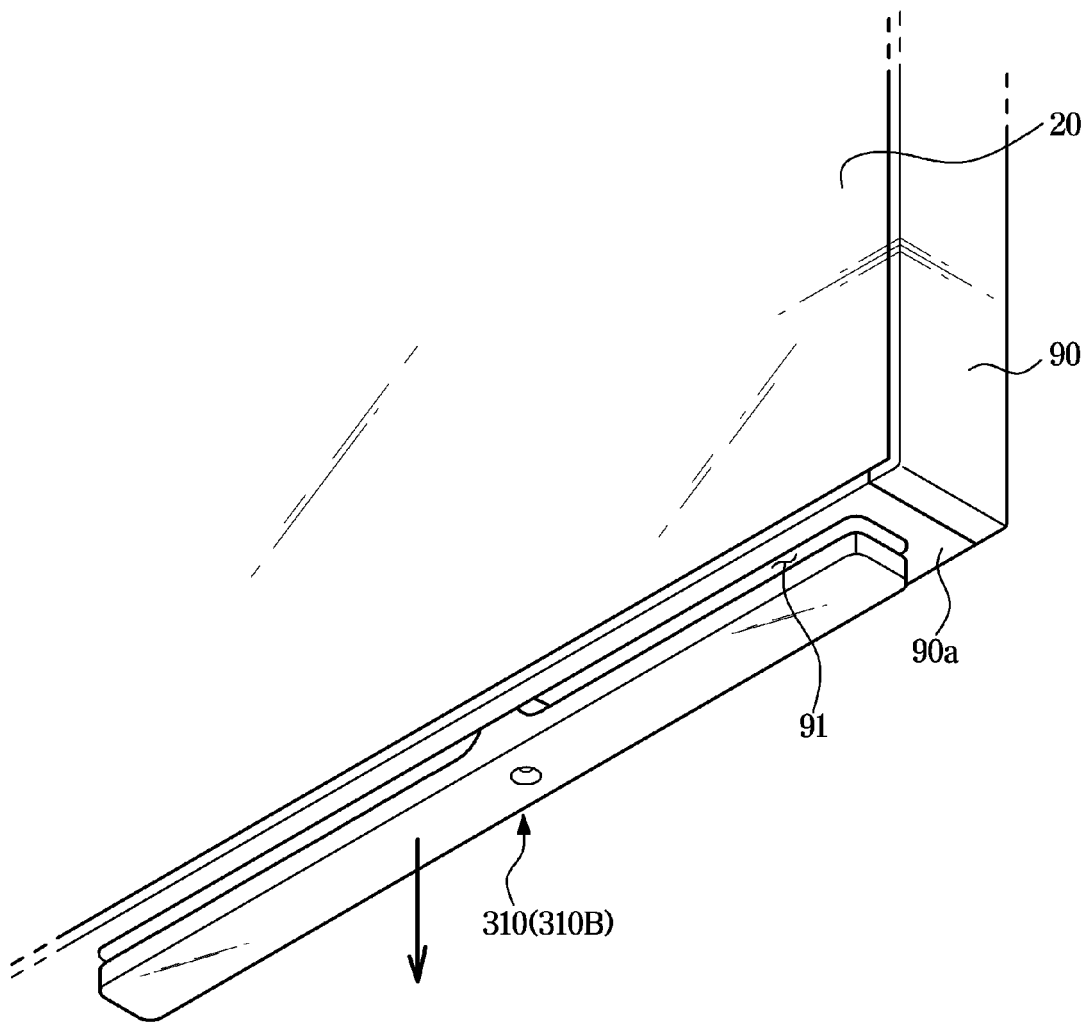
FIG. 18 is a bottom perspective view of the display device with the stand member partially pulled out, according to the third embodiment of the disclosure.
Figure 19:
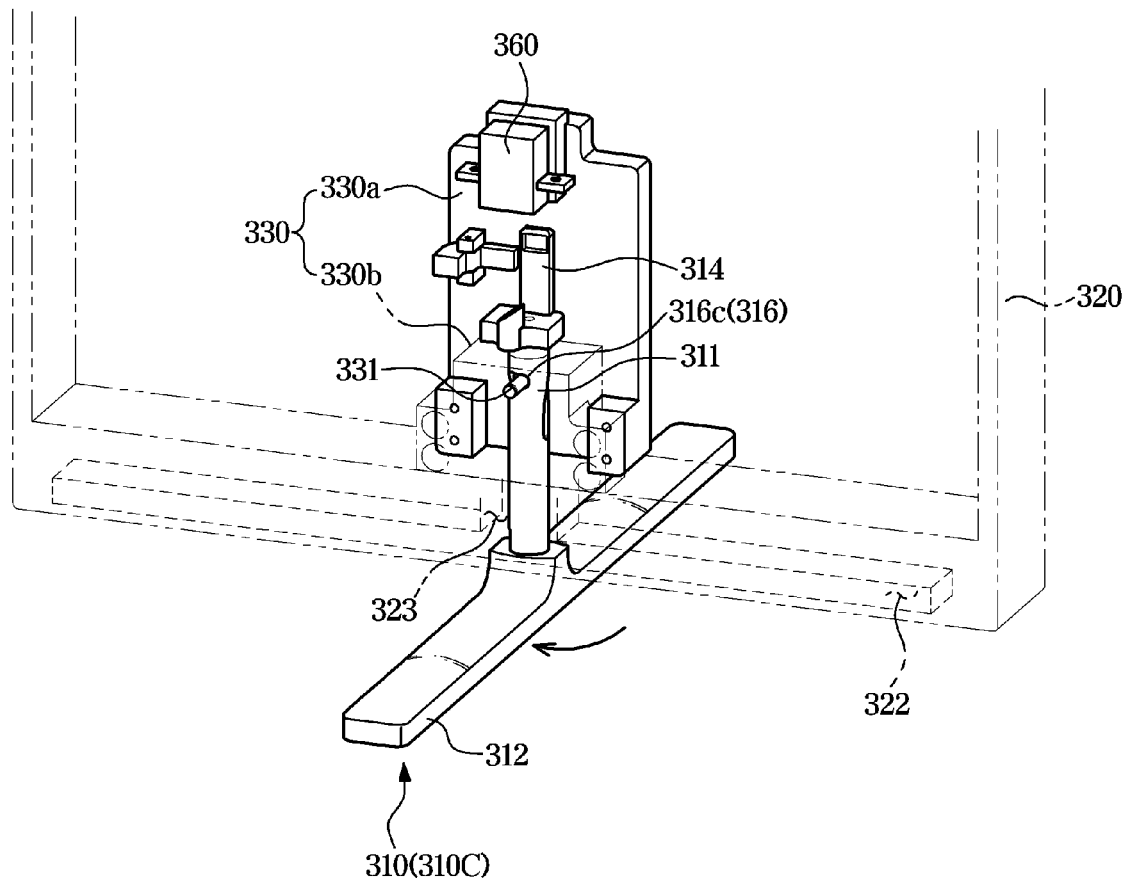
FIG. 19 shows the stand unit of the display device with the stand member fully pulled out, according to the third embodiment of the disclosure.
Figure 20:
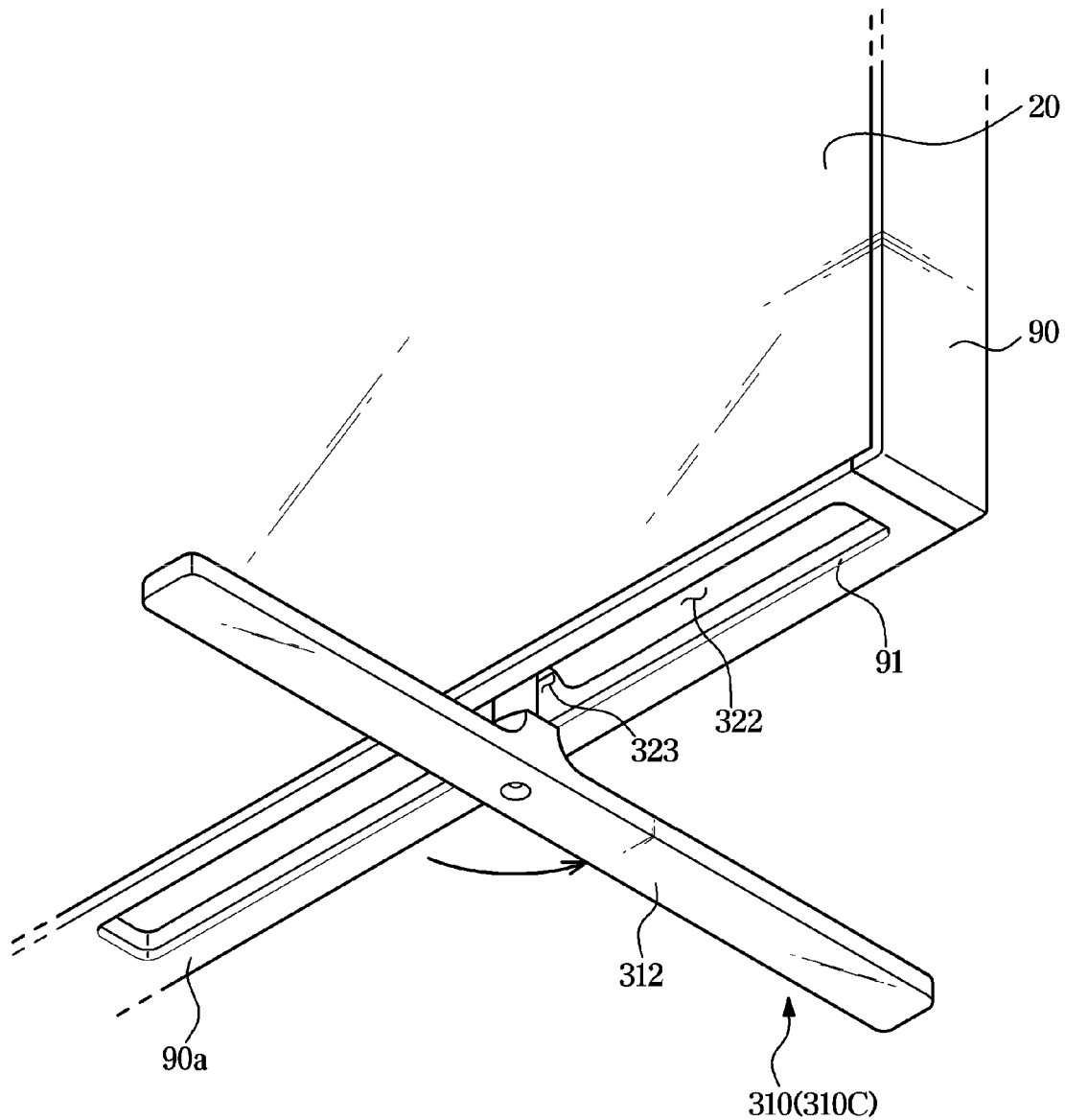
FIG. 20 is a bottom perspective view of the display device with the stand member fully pulled out, according to the third embodiment of the disclosure.

FIG. 15 shows a stand unit of a display device with a stand member pulled in, according to a third embodiment of the disclosure, FIG. 16 is a bottom perspective view of the display device with the stand member pulled in, according to the third embodiment of the disclosure, FIG. 17 shows the stand unit of the display device with the stand member partially pulled out, according to the third embodiment of the disclosure, FIG. 18 is a bottom perspective view of the display device with the stand member partially pulled out, according to the third embodiment of the disclosure, FIG. 19 shows the stand unit of the display device with the stand member fully pulled out, according to the third embodiment of the disclosure, and FIG. 20 is a bottom perspective view of the display device with the stand member fully pulled out, according to the third embodiment of the disclosure.

In the third embodiment, the stand unit 300 may include a stand 310 provided to be movable in the vertical direction, a case 320, and a housing 330 fixed to the case 310 to allow the stand 310 to be pulled in or out of the case 320.

The stand unit 300 may also include a locking device 360 to fix the stand 310 by locking the stand 310 to remain in a state of being received in the case 320.

The locking device 360 may be arranged on the top of the stand 310. At least a portion of the stand 310 may be put into and constrained by the locking device 360, and accordingly, the stand 310 may be locked in the locking device 360.

When the stand 310 is released from the locked state, the stand 310 may be moved down by its self-weight. Accordingly, the stand 310 may be pulled out of the case 320.

When the stand 310, which has been pulled out, is pushed up, the stand 310 is moved up again by the external force, and at least a portion of the stand 310 in turn pushes the locking device 360 and accordingly, is constrained back in the locking device 360, ending up with the stand 310 being pulled back into the case 320.

The housing 330 may include a first housing 330a coupled with the case 320 and a second housing 330b coupled with the first housing 330a. Certain space may be formed between the first and second housings 330a and 330b for the stand 310 to be inserted thereto.

The stand 310 is inserted to the certain space, and the first and second housings 320a and 320b may be combined. The stand 310 may be moved vertically in the certain space.

The stand 310 may include a body portion 311 inserted to the housing 330, a locked portion 314 arranged on the top of the body portion 311 and inserted to and constrained by a locking device 360, and the supporting portion 312 provided to be pulled out of the display device 1 when the stand 310 is unlocked and thus support the display device 1 from the floor.

The second housing 330b may include a guide projection 331 for guiding movement of the body portion 311. It is not, however, limited thereto, and the guide projection 331 may be arranged in the first housing 330a in another embodiment.

The body portion 331 may include a rail 316 to which the guide projection 331 is inserted. The body portion 331 may be vertically moved while the guide projection 331 is inserted to the rail 316.

Accordingly, the body portion 331 may be moved along the direction in which the rail 316 extends.

At least a portion of the rail 316 may extend straight vertically, and some other portion of the rail 316 may be curved in the vertical direction.

Hence, the body portion 331 may be moved vertically when the guide projection 331 is in the straight portion of the rail 316, and may be rotated along the curve of the rail 316 when the guide projection 331 is in the curved portion. This will be described in more detail later.

A process in which the stand 310 is pulled in or pulled out by the stand unit 300 will now be described in detail.

As shown in FIGS. 15 and 16, when the display device 1 is in a packaged state or installed on the wall in the mount-type, the stand 310 may be placed in a pull-in position 310A.

When the stand 310 is placed in the pull-in position 310A, the supporting portion 312 may be located in a receiving groove 322 (see FIG. 19) formed on the bottom side of the case 320.

The supporting portion 312 may be provided to be perpendicular to the body portion 311, and when the stand 310 is placed in the pull-in position 310A, may lie along the length of the display device 1.

In other words, when the stand 310 is placed in the pull-in position 310A, the supporting portion 312 may lie in the horizontal direction of the display device 1.

The receiving groove 322 may also be formed to extend along the horizontal direction of the display device 1.

When the stand 310 is placed in the pull-in position 310A, it lies inside the case 320 or display device 1 and is not exposed.

When the stand 310 is placed in the pull-in position 310A, it is not pulled out of the through hole 91 and thus, not exposed, but it is possible for the user to push the stand 310 upward through the through hole 91 from the outside.

The user may push the stand 310 upward to pull the stand 310 out of the display device 1.

When the stand 310 is pushed up, the locked portion 314 inserted to the locking device 360 may be moved up to push the locking device 360 from inside the locking device 360.

As the locking device 360 is pushed, the locked portion 314 may be unlocked, and the stand 310 may be unlocked accordingly.

The stand 310 may move down by its self-weight.

As shown in FIGS. 17 and 18, the stand 310 may move down by the self-weight, and accordingly, the supporting portion 312 may be pulled out of the receiving groove 322 of the case 320 and may pass through the through hole 91 of the rear cover 90, and the body portion 311 may be pulled down through the opening 323 of the case 320.

Hence, the stand 310 may be placed in a middle position 310B by moving down from the pull-in position 310A.

While the stand 310 is moving from the pull-in position 310A to the middle position 310B, the guide projection 331 may be placed in a first area 316a of the rail 316. The first area 316a is an area in which the rail 316 extends straight in the vertical direction. In the first area 316a, the guide projection 331 may guide the stand 310 for the body portion 311 to be moved in the vertical direction.

The supporting portion 312 may then be moved down by keeping the direction in which the supporting portion 312 lies that corresponds to the horizontal direction of the display device 1.

Subsequently, when the guide projection 331 is located in a second area 316b of the rail 316, the body portion 311 may be moved down by being rotated in one direction along the curve of the second area 316b. The supporting portion 312 may be moved down by being engaged with the body portion 311 and rotated in one direction.

Although not shown, the stand unit 300 may further include a gear portion coupled to the body portion 311. The gear portion may include a plurality of gears, in which case at least one gear may be coupled to the body portion 311 and at least another gear may be coupled to the housing 330.

Moving speed of the stand 310 may be controlled by the gear portion, enabling the stand 310 to be stably moved, thereby increasing reliability and beauty of the stand 310.

Referring to FIGS. 19 and 20, when the guide projection 331 reaches an end 316c of the second area 316b of the rail 316, the guide projection 331 may be stuck in the rail 316 and the body portion 311 may not move down any longer and keep the fallen state.

The stand 310 may then be in a supporting position 310C at which to support the display device 1.

The supporting portion 312 may be engaged with the body portion 311 and rotated along the curve of the rail 316, e.g., about 90 degrees in one direction.

In other words, the length and curvature of the curve of the second area 316b may be adjusted such that the body portion 311 may be rotated about 90 degrees until the guide projection 331 reaches the end 316c.

As the supporting portion 312 is rotated about 90 degrees, the supporting portion 312 may lie in a direction from front to back of the display device 1. Hence, the supporting portion 312 may stably support the display device 1.

Although not shown, a stopper may be included to keep the state in which the guide projection 331 and the end 316c come into contact with each other.

The stopper may be a section of the rail 316 extending from the end 316c to the opposite for restricting the guide projection 331 from moving, and may be provided separately to press the body portion 311 to restrict movement of the body portion 311.

The stand 310 may be rotated to change the direction in which the supporting portion 312 lies while moving from the middle position 310B to the supporting position 310C.

Hence, when the stand 310 is placed in the supporting position 310C, the stand unit 300 may place the stand 310 to support the display device 1.

A fourth embodiment of the disclosure will now be described. Description of overlapping components with those of the previous embodiments will not be repeated.

Figure 21:
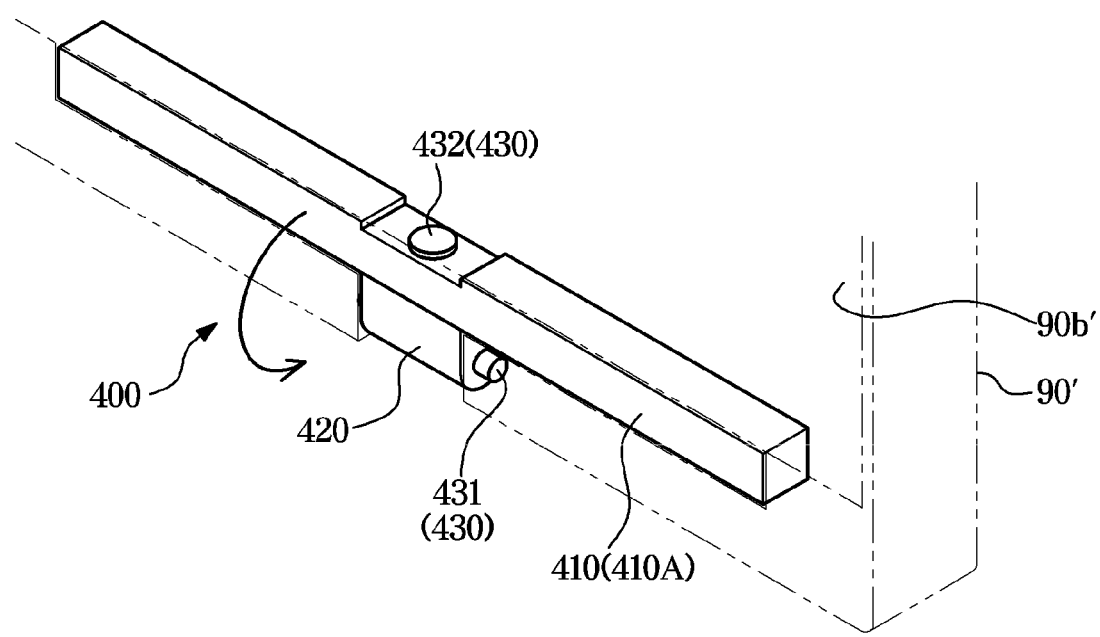
FIG. 21 is a rear perspective view of a display device with a stand member pulled in, according to a fourth embodiment of the disclosure.
Figure 22:
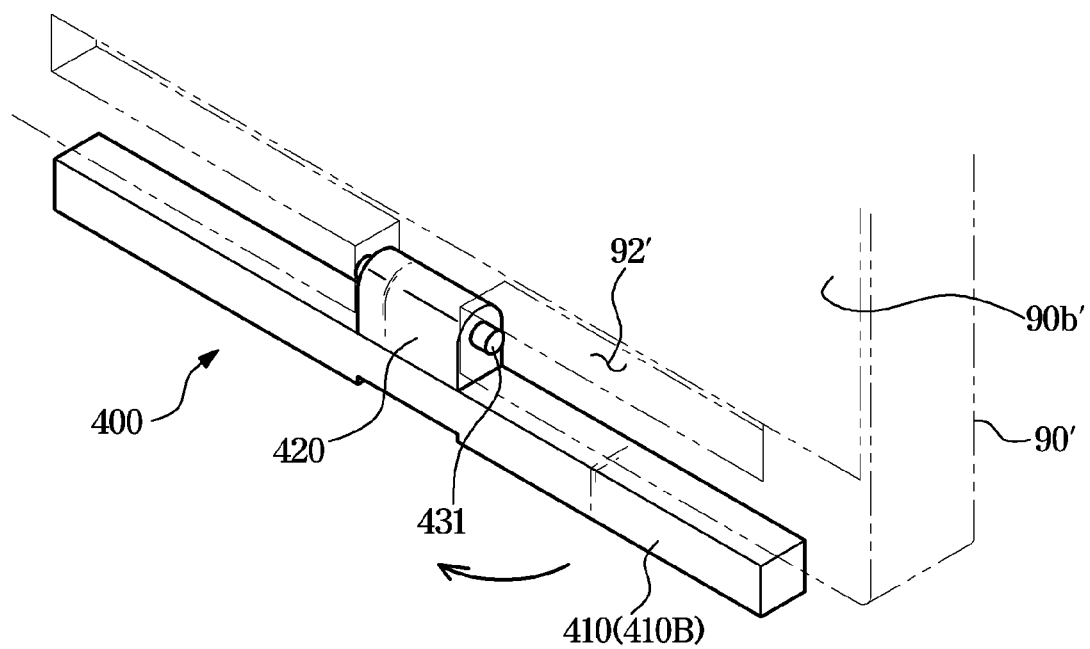
FIG. 22 is a rear perspective view of the display device with the stand member pulled in, according to the fourth embodiment of the disclosure.
Figure 23:
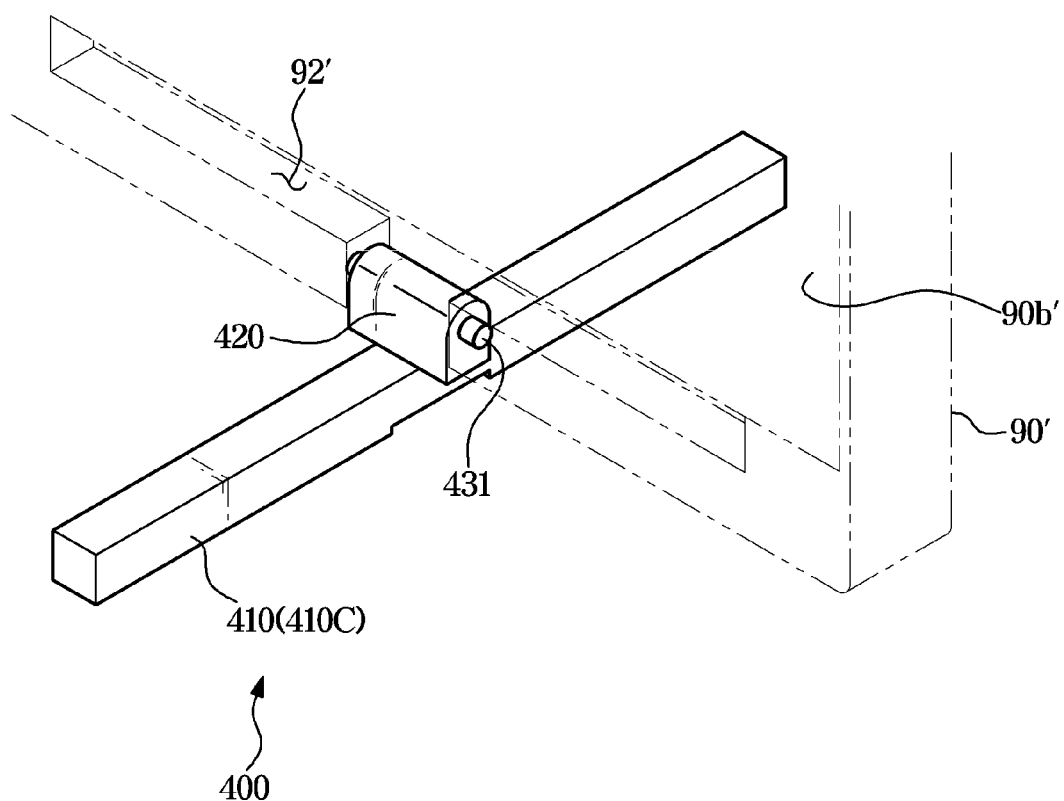
FIG. 23 is a rear perspective view of the display device with the stand member fully pulled out, according to the fourth embodiment of the disclosure.

FIG. 21 is a rear perspective view of a display device with a stand member pulled in, according to a fourth embodiment of the disclosure, FIG. 22 is a rear perspective view of the display device with the stand member pulled in, according to the fourth embodiment of the disclosure, and FIG. 23 is a rear perspective view of the display device with the stand member fully pulled out, according to the fourth embodiment of the disclosure.

In the fourth embodiment, the display device 1 may include a stand unit 400 that may be pulled in or out of a rear side 90b' of a rear cover 90'.

The stand unit 400 may include a stand 410 provided to support the display device 1 when the stand unit 400 is pulled out of the rear cover 90', a hinge part 420 provided for the stand 410 to be turned to a first direction or a second direction which is perpendicular to the first direction, and a rotation shaft 430 provided for the stand 410 to be rotated in the first or second direction.

The rotation shaft 430 may include a first rotation shaft 431 provided for the stand 410 to be turned in the first direction, and a second rotation shaft 432 provided for the stand 410 to be turned in the second direction.

The first rotation shaft 431 may be provided to bore through the hinge part 420 and have both ends placed inside the rear cover 90'.

The second rotation shaft 432 may be provided to bore through the stand 410 and the hinge part 420 for the stand 410 to be rotated against the hinge part 420.

The hinge part 420 may be rotated by the first rotation shaft 431 against the rear cover 90'. Specifically, the hinge part 420 may be coupled with the rear cover 90' to be turned to the front and back of the display device 1.

The stand 410 may be coupled with the hinge part 420 to be rotated by the second rotation shaft 432 against the hinge part 420. Specifically, the hinge part 420 may be rotationally coupled with the rear cover 90' and the stand 410 may be rotationally coupled with the hinge part 420.

As shown in FIG. 21, the stand unit 400 may be in a pull-in position 410A, when the display device 1 is in a packaged state or installed on the wall in the mount-type.

When the stand 410 is placed in the pull-in position 410A, it lies inside the rear cover 90' or display device 1 and is not exposed.

In the pull-in position 410A, the stand 410 may be pulled into a receiving groove 92' formed on a rear side 90b' of the rear cover 90'.

The stand 410 is not pulled out of the receiving groove 92' and thus, not exposed, but it is possible for the user to pull out the stand 410 through the receiving groove 92'.

To pull the stand 410 out of the display device 1, the user may pull out the stand 410 from the receiving groove 92'.

When the stand 410 is pulled out, it may be turned down around the first rotation shaft 431 by its self-weight.

Referring to FIG. 22, the stand 410 may be turned down by its self-weight, and thus pulled down from the display device 1.

Hence, the stand 410 may be placed in a middle position 410B by moving down from the pull-in position 410A.

When the stand 410 is placed in the middle position 410B, the user may turn the stand 410 around the second rotation shaft 432, in which case since the second rotation shaft 432 extends vertically, the stand 410 may be turned to the front and back of the display device 1.

Although not shown, the stand unit 400 may further include a gear portion arranged between the stand 410 and the hinge part 420. The gear portion may include a plurality of gears, in which case at least one gear may be coupled to the stand 410 and at least another gear may be coupled to the hinge part 420.

Moving speed of the stand 410 may be controlled by the gear portion, enabling the stand 410 to be stably turned, thereby increasing reliability and beauty of the stand 410.

Referring to FIG. 23, the stand 410 is turned to the front and back of the display device 1 to be in a supporting position 410C at which to support the display device 1.

The stand 410 may be rotated about 90 degrees against the hinge part 420.

The hinge part 420 may include a stopper (not shown) for the stand 410 to be rotated about 90 degrees against the hinge part 420. The stopper may restrict rotation of the stand 410 such that the stand 410 is not rotated more than about 90 degrees against the hinge part 420.

The stand unit 400 may further include a stand check member (not shown) to prevent the stand 410 from being turned in the opposite direction after the stand 410 is turned about 90 degrees.

The stand check member may check rotation of the stand 410 to prevent the stand 410 from being turned to any direction after the stand 410 is rotated 90 degrees against the hinge part 420, thereby enabling the stand 410 to stably support the display device 1.

A fifth embodiment of the disclosure will now be described. Description of overlapping components with those of the previous embodiments will not be repeated.

Figure 24:
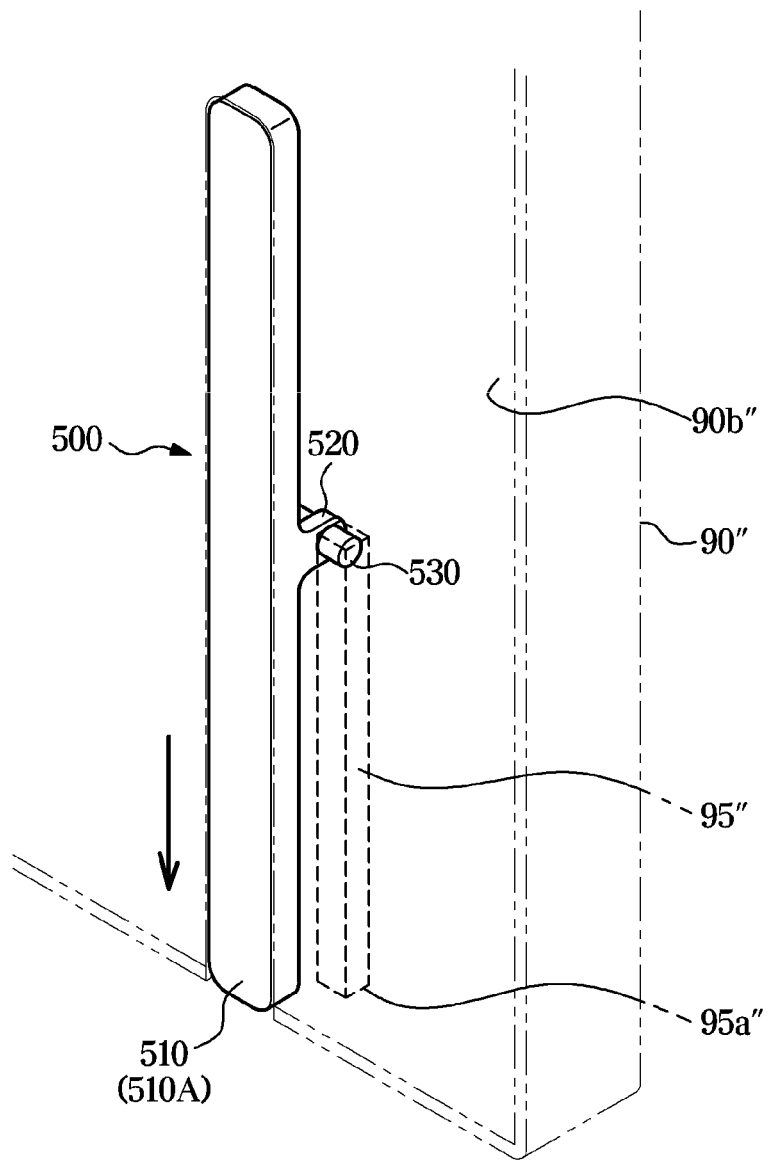
FIG. 24 is a rear perspective view of a display device with a stand member pulled in, according to a fifth embodiment of the disclosure.
Figure 25:
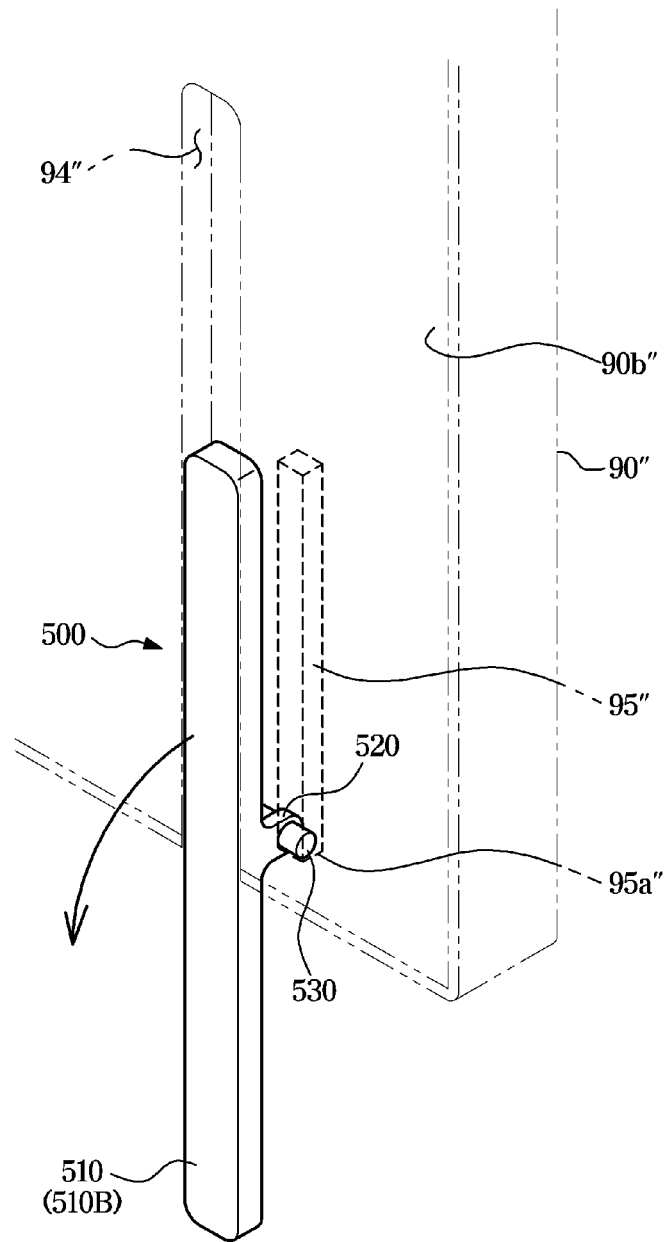
FIG. 25 is a rear perspective view of a display device with a stand member pulled out, according to the fifth embodiment of the disclosure.
Figure 26:
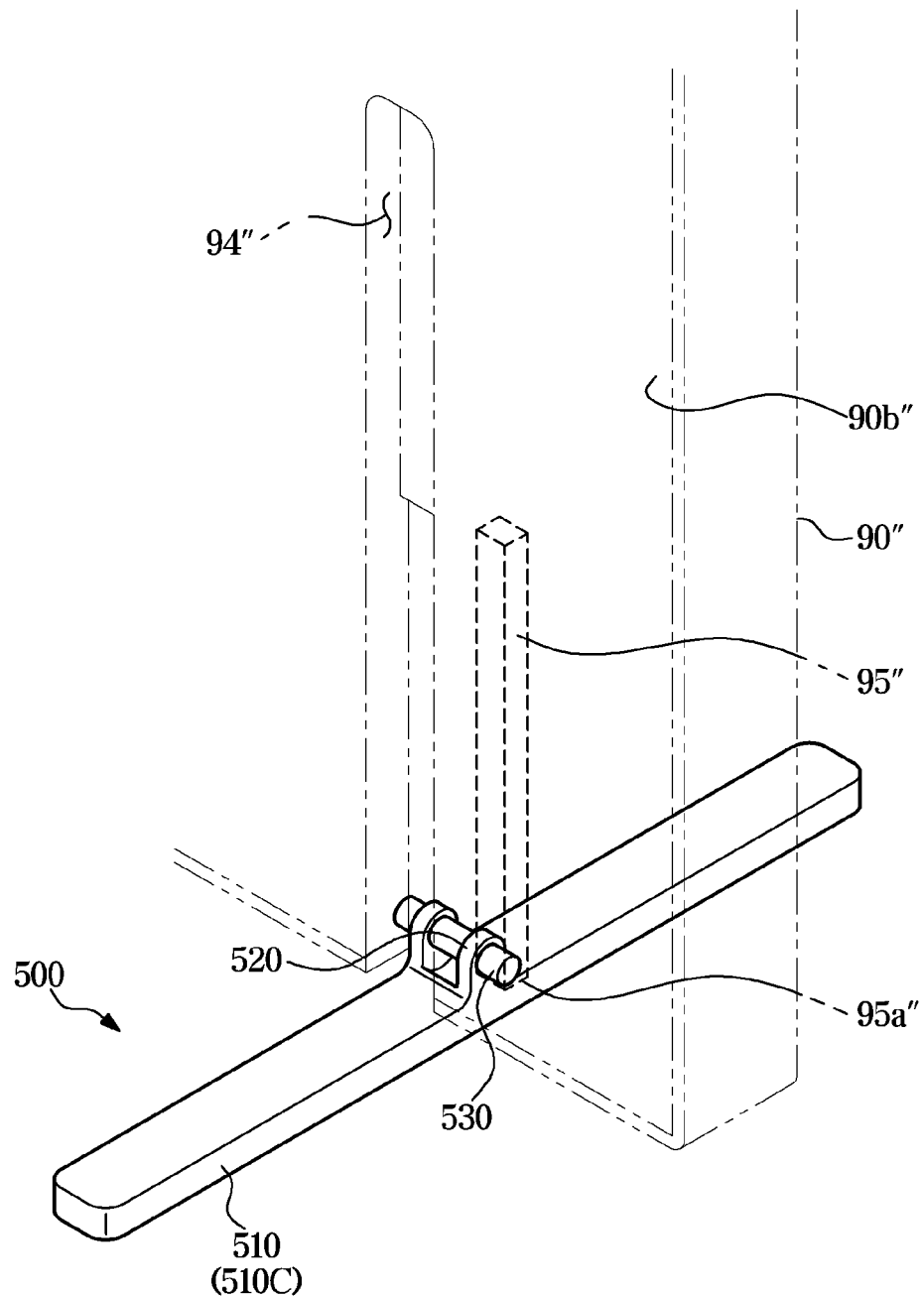
FIG. 26 is a rear perspective view of the display device with the stand member fully pulled out, according to the fifth embodiment of the disclosure.

FIG. 24 is a rear perspective view of the display device with the stand member pulled in, according to the fifth embodiment of the disclosure, FIG. 25 is a rear perspective view of the display device with the stand member pulled in, according to the fifth embodiment of the disclosure, and FIG. 26 is a rear perspective view of the display device with the stand member fully pulled out, according to the fifth embodiment of the disclosure.

In the fifth embodiment, the display device 1 may include a stand unit 500 that may be pulled in or out of a rear side 90b" of a rear cover 90".

The stand unit 500 may include a stand 510 provided to support the display device 1 when the stand unit 500 is pulled out of the rear cover 90", a hinge part 520 provided for the stand 510 to be turned, and a rotation shaft 530 provided for the stand 510 to be turned.

Referring to FIG. 24, the stand 510 may be in a pull-in position 510A, when the display device 1 is in a packaged state or installed on the wall in the mount-type.

When the stand 510 is placed in the pull-in position 510A, it lies inside the rear cover 90" or display device 1 and is not exposed.

In the pull-in position 510A, the stand 510 may be pulled into a first receiving groove 94" formed on the rear side 90b" of the rear cover 90".

The hinge part 520 and the rotation shaft 530 may be pulled in a second receiving groove 95" formed inside the rear cover 90".

The stand 510 is not pulled out of the first receiving groove 94" and thus, not exposed, but it is possible for the user to pull out the stand 510 through the first receiving groove 94".

To pull the stand 510 out of the display device 1, the user may push the stand 510 downward through the first receiving groove 94".

The stand 510 and the hinge part 520 may be integrally formed. Furthermore, the rotation shaft 530 may penetrate the hinge part 520. Accordingly, the hinge part 520 and the rotation shaft 530 may be moved down by being engaged with the stand 510.

In this case, the hinge part 520 and the rotation shaft 530 may be moved down along the second receiving groove 95".

The first receiving groove 94" may be formed on the rear side 90b" of the rear cover 90" to vertically extend to the bottom of the rear cover 90".

The lower end of the first receiving groove 94" may be cut. The stand 510 may be rotated at the lower end of the first receiving groove 94", as will be described below.

The second receiving groove 95" may be formed inside the rear cover 90" to extend vertically like the first receiving groove 94".

Although not shown, there may be an anti-deviation member included to prevent the stand 510 placed in the pull-in position 510A from deviating from the pull-in position 510A. Accordingly, the stand 510 may be prevented from sliding down from the pull-in position 510A simply by external force.

Referring to FIG. 25, the stand 510 may slide down when pushed by the user, and may thus be pulled down from the display device 1.

Hence, the stand 510 may be placed in a middle position 510B by moving down from the pull-in position 510A.

When the stand 510 is placed in the middle position 510B, the hinge part 520 and the rotation shaft 530 may be in the middle position 510B as well.

In the middle position 510B, the rotation shaft 530 may be located at the lower end 95a" of the second receiving groove 95". In this case where the stand 510 is placed in the middle position 510B, the rotation shaft 530 reaches the lower end 95a" and is prevented from moving further down, and accordingly, the stand 510 may be restricted from moving further down from the middle position 510B.

Subsequently, the stand 510 may be turned around the rotation shaft 530 from the middle position 510B. The rotation shaft 530 may extend in the horizontal direction of the display device 1.

Hence, the stand 510 may be turned to the front and back of the display device 1.

Although not shown, the stand unit 500 may further include a rack-pinion section arranged between the stand 510 and the first receiving groove 94". The rack-pinion section may include a rack and a pinion, at least one of which may be coupled with the stand 510 and the other of which may be coupled with the first receiving groove 94".

Moving speed of the stand 510 may be controlled by the rack-pinion section, enabling the stand 510 to slide stably, thereby increasing reliability and beauty of the stand 510.

It is not limited thereto, and instead of the rack-pinion section, a rail or some other structure may be arranged between the stand 510 and the first receiving groove 94" to guide sliding of the stand 510.

Referring to FIG. 26, the stand 510 is turned to the front and back of the display device 1 to be in a supporting position 510C at which to support the display device 1.

The stand 510 may be rotated about 90 degrees from the pull-in position 510A.

The stand unit 500 may include a stopper (not shown) for the stand 510 to be rotated about 90 degrees from the pull-in position 510A. The stopper may restrict rotation of the stand 510 such that the stand 510 may not be rotated more than about 90 degrees from the pull-in position 510A.

The stand unit 500 may further include a stand check member (not shown) to prevent the stand 510 from being turned in the opposite direction after the stand 510 is turned about 90 degrees from the pull-in position 510A.

The stand check member may check rotation of the stand 510 to prevent the stand 510 from being turned to any direction after the stand 510 is rotated 90 degrees, thereby enabling the stand 410 to stably support the display device 1.

According to embodiments of the disclosure, a display device may include a stand unit that pulls a stand member into the display device when the display device is installed on the wall and pulls out the stand member to support the display device when the display device is placed on the floor, thereby eliminating the need for keeping the stand member separately, and thus preventing losing the stand member.

The stand member may be pulled in the display device not be exposed when the display device is installed on the wall, thereby improving the beauty of the display device.

Furthermore, when the user places the display device on the floor, the stand member may be easily pulled from inside the display device, thereby increasing user convenience.

Several embodiments have been described above, but a person of ordinary skill in the art will understand and appreciate that various modifications can be made without departing the scope of the present disclosure. Thus, it will be apparent to those ordinary skilled in the art that the true scope of technical protection is only defined by the following claims.

What is claimed is:

1. A display device comprising:
a display panel to display an image;
a chassis arranged on a back side of the display panel;
a cover formed with an opening, the cover covering a back side of the chassis and a bottom side of the chassis;
a stand to support the display device and being storable in an open space between the chassis and the cover;
a locking device to lock the stand in the open space to thereby store the stand within the display device and to release the stand from the open space; and
a rotation guide,
wherein the stand, the locking device, and the rotation guide are configured so that,
when the stand is locked in the open space by the locking device and is thereby stored within the display device, the release of the stand from the open space by the locking device allows the stand to be pulled out of the display device through the opening by self-weight of the stand, and at least a portion of the stand to be rotated by the rotation guide, so that the stand is in position to support the display device.

2. The display device of claim 1, wherein the locking device is arranged on a top of the stand to release the stand from being locked by the locking device when the stand is pushed up, and to lock the stand when the stand is inserted to the locking device by being pushed up from being unlocked.

3. The display device of claim 2, wherein the stand is moved down and pulled out of the display device when released by the locking device from being locked.

4. The display device of claim 1, wherein the locking device is provided to lock or unlock the stand when the stand is pushed.

5. The display device of claim 1, wherein the stand comprises a body portion, a locked portion arranged on a top of the body portion and locked in the locking device, and a supporting portion arranged beneath the body portion and pulled out of the display device to support the display device when the stand is unlocked.

6. The display device of claim 5, wherein
the supporting portion comprises a first supporter and a second supporter, and
the first supporter and the second supporter are provided to contact each other when the stand is stored into the display device, and to be unfolded when the stand is pulled out of the display device.

7. The display device of claim 6, wherein
the supporting portion further comprises a rotation shaft corresponding to a rotation axis of at least the portion of the stand, and
the first supporter and the second supporter are provided to be unfolded by being rotated around the rotation shaft in a state of contacting each other.

8. The display device of claim 7, further comprises
a stand compartment comprising an elastic member arranged in the supporting portion, and
the elastic member is provided to transmit elastic force to rotate the first supporter and the second supporter.

9. The display device of claim 7, wherein
the stand compartment further comprises a gas cylinder provided to contract or expand by being engaged with vertical movement of the body portion, and
the gas cylinder is provided to apply pressure to the body portion to rotate the first supporter and the second supporter.

10. The display device of claim 9, wherein
the stand compartment further comprises a transmitter provided to transmit a force created by the gas cylinder to the body portion,
the body portion comprises a gear portion driven by the transmitter, and
the gear portion is provided to be rotated to enable the first supporter and the second supporter to be rotated.

11. The display device of claim 7, wherein the rotation shaft extends in a direction corresponding to a direction in which the body portion extends.

12. The display device of claim 7, wherein the rotation shaft extends in a direction parallel to length of the display panel.

13. The display device of claim 7, wherein
the stand compartment further comprises a restricting member provided to constrain the first supporter and the second supporter to restrict rotation of the first supporter and the second supporter, and
the restricting member is engaged with the self-weight based movement of the stand to release constraint on the first supporter and the second supporter.

14. The display device of claim 5, further comprises
a stand compartment comprising a housing provided to cover the body portion,
wherein the rotation guide comprises a guide projection arranged in the housing to guide movement of the body portion, and a rail arranged in the body portion for the guide projection to be inserted to the rail.

15. The display device of claim 14, wherein the rail comprises a first area for guiding the guide projection into a vertical direction and a second area for guiding the guide projection to be rotationally moved.

16. A display device comprising:
a display panel to display an image;
a chassis arranged on a back side of the display panel;
a cover formed with an opening, the cover covering a back side of the chassis and a bottom side of the chassis;
a stand to support the display device and being storable in the cover; and
a rotation shaft,
wherein the stand and the rotation shaft are configured so that,
when the stand is stored in the cover, the stand is pullable out of the cover though the opening and rotatable around the rotation shaft to be in a position in which the stand supports the display device.

17. The display device of claim 16, wherein the cover comprises a storage groove arranged on a rear side of the cover to receive the stand.

18. The display device of claim 16, wherein the rotation shaft comprises a first rotation shaft provided to have both ends settled in the cover and to rotate the stand in a first direction, and a second rotation shaft provided to be inserted to the stand to rotate the stand in a second direction.

19. The display device of claim 17, wherein the stand is provided to slide down in the storage groove to be pulled out of the storage groove.

20. A display device comprising:
a display panel to display an image;
a chassis arranged on a back side of the display panel;
a cover covering a back side of the chassis and a bottom side of the chassis;
a stand positionable in a first position in which the stand is settled inside edges of the cover and thereby stored in the cover and a second position in which the stand supports the display device; and
a rotation shaft,
wherein the stand and the rotation shaft are configured so that,
when the stand is in the first position, the stand is pullable from inside the cover to outside the cover and rotatable around the rotation shaft to be in the second position.

\* \* \* \* \*